United States Patent [19]
Kim et al.

[11] Patent Number: 5,995,175
[45] Date of Patent: *Nov. 30, 1999

[54] LIQUID CRYSTAL DISPLAY AND A METHOD FOR MANUFACTURING THE SAME

[75] Inventors: Sang-soo Kim, Seoul; Dong-gyu Kim, Kyungki-do; Yong-gug Bae, Kyungki-do; Jong-in Choung, Kyungki-do; Jun-ho Song, Kyungki-do, all of Rep. of Korea

[73] Assignee: Samsung Electronics Co., Ltd., Kyungki-do, Rep. of Korea

[*] Notice: This patent is subject to a terminal disclaimer.

[21] Appl. No.: 09/017,492

[22] Filed: Feb. 2, 1998

Related U.S. Application Data

[62] Division of application No. 08/600,499, Feb. 13, 1996, Pat. No. 5,767,926, which is a continuation of application No. 08/205,500, Mar. 4, 1994, Pat. No. 5,517,342.

[30] Foreign Application Priority Data

Mar. 4, 1993 [KR] Rep. of Korea ............... 93-3208
Mar. 19, 1993 [KR] Rep. of Korea ............... 93-4289

[51] Int. Cl.$^6$ .................. G02F 1/136; G02F 1/1343
[52] U.S. Cl. .................. 349/43; 349/42; 349/139
[58] Field of Search ................ 349/42, 43, 139, 349/149, 143

[56] References Cited

U.S. PATENT DOCUMENTS

| | | | |
|---|---|---|---|
| 4,145,120 | 3/1979 | Kubota | 359/88 |
| 5,028,122 | 7/1991 | Hamada | 359/59 |
| 5,187,602 | 2/1993 | Ikeda | 359/59 |
| 5,193,017 | 3/1993 | Iwai et al. | 349/43 |
| 5,206,749 | 4/1993 | Zavracky | 359/59 |
| 5,231,039 | 7/1993 | Sakano | 437/41 |
| 5,233,448 | 8/1993 | Wu | 359/59 |
| 5,339,181 | 8/1994 | Kim et al. | 349/42 |
| 5,517,341 | 5/1996 | Kim et al. | 359/59 |
| 5,517,342 | 5/1996 | Kim et al. | 349/43 |
| 5,648,826 | 7/1997 | Song et al. | 349/42 |
| 5,767,926 | 6/1998 | Kim et al. | 349/38 |

FOREIGN PATENT DOCUMENTS

| | | |
|---|---|---|
| 0 412 831 A1 | 2/1991 | European Pat. Off. . |
| 0 435 101 A1 | 7/1991 | European Pat. Off. . |
| 2-278231 | 11/1990 | Japan . |
| 3239229 | 10/1991 | Japan . |
| 4090513 | 3/1992 | Japan . |
| 4104227 | 4/1992 | Japan . |
| 4264529 | 9/1992 | Japan ............ 359/59 |
| 5265036 | 10/1993 | Japan ............ 359/59 |

OTHER PUBLICATIONS

M. Tsumura et al., "High–Resolution to 3–In. Diagonal Multicolor TFT–LCD," SID 91 Digest, pp. 215–218.

*Primary Examiner*—William L. Sikes
*Assistant Examiner*—Dung Nguyen
*Attorney, Agent, or Firm*—Pillsbury Madison & Sutro LLP

[57] ABSTRACT

A liquid crystal display having an improved display characteristic and having a ring-structured storage capacitor of an independent wiring type wherein disconnection and/or short circuit defects are reduced and a method for manufacturing the same. The liquid crystal display has one or a plurality of first electrodes within each pixel region, for forming one or a plurality of auxiliary capacitors in conjunction with the opposing pixel electrode. The first electrodes surround the pixel electrodes in a ring type structure, and are connected to each other between adjacent pixel portions by at least one wiring connecting portion. The first electrodes are driven independently from the scanning signal lines and the display signal lines. Forming the first electrodes of the capacitors as independent wiring type having a ring structure simplifies the manufacturing process and utilizes the maximum pixel area. Also, the degree of freedom concerning the selection of the driving pulse signal of the liquid crystal display is improved to reduce the R-C delay.

6 Claims, 16 Drawing Sheets

5,995,175

LIQUID CRYSTAL DISPLAY AND A METHOD FOR MANUFACTURING THE SAME

This application is a divisional of application Ser. No. 08/600,499 filed Feb. 13, 1996, now U.S. Pat. No. 5,767,926; which is a continuation of application Ser. No. 08/205,500 filed Mar. 3, 1994, now U.S. Pat. No. 5,517,342.

BACKGROUND OF THE INVENTION

The present invention relates to a liquid crystal display and a method for manufacturing the same, and more particularly to an active matrix liquid crystal display wherein the display characteristics thereof are improved by an increase in the aperture ratio and a reduction of the capacitance of the gate wiring, and to a method for manufacturing the same.

The present invention is an improvement over the invention which is the subject matter of the present inventors' U.S. Pat. No. 5,517,341 which was filed on Jun. 1, 1993, the disclosure of which is hereby incorporated into this application by reference.

In response to a demand for personalized, space-saving displays which serve as the interface between humans and computers (and other types of computerized devices), various types of flat screen or flat panel displays, such as a liquid crystal display (LCD), a plasma display panel (PDP), an electroluminescent (EL) display, etc., have been developed to replace conventional display devices, particularly a cathode-ray tube (CRT) which is relatively large and obtrusive. Among these flat panel display types, the progress of LCD technology attracts the most interest. In some forms, LCDs match or surpass the color picture quality of CRTs.

Liquid crystal displays can have a simple matrix form or an active matrix form, using an electro-optic property of the liquid crystal whose molecular arrangement is varied according to an electric field. In particular, the LCD in the active matrix form utilizes a combination of liquid crystal technology and semiconductor technology, and is recognized as being superior to CRT displays.

The active matrix LCDs utilize an active device having a non-linear characteristic in each of a plurality of pixels arranged in a matrix configuration, using the switching characteristic of the device to thereby control each pixel. One type of the active matrix LCD embodies a memory function through an electro-optic effect of the liquid crystal. A thin film transistor (hereinafter referred to as a "TFT") having three terminals is ordinarily used as the active device, or a thin film diode (TFD), for example, a metal insulator metal type (MIM) having two terminals, is used. In the active matrix LCD which utilizes such active devices, millions or even billions of pixels are integrated on a glass substrate together with pixel address wiring, to thereby provide a matrix driver circuit, with the TFTs serving as switching elements.

However, in the active matrix LCD whose display has a large screen and high definition, the number of the pixels increases. Accordingly, the aperture ratio of the individual pixels is decreased, thereby concomitantly reducing the brightness of the LCD.

In the meantime, in the above active matrix LCD, a capacitance (Cgd) results between the gate and drain electrode of the TFT. When the signal of the gate pulse is changed from "High" to "Low", the potential of the pixel electrode is lowered due to the effect of the above capacitance Cgd. This lowering potential change is conventionally referred to as "offset voltage". When the offset voltage is applied to the liquid crystal as a direct voltage, an unfavorable phenomenon such as image sticking, flicker generation etc., occurs. Therefore, reducing such an offset voltage is necessary, as by forming an auxiliary capacitor in parallel with the liquid crystal cell.

Further, to obtain uniformity of an image displayed on the active matrix LCD, it is necessary that the voltage of a first signal applied through a data line in a writing operation is held constant for a certain time until a second signal is received. Also, in order to improve the image quality of the display, an auxiliary capacitor is formed in parallel with a liquid crystal cell. When the writing operation to the LCD is performed at a frequency of 60 Hz, the retaining duration is 16.7 milliseconds. The time constant, which is determined by the resistance of the liquid crystal and the dielectric constant thereof, must be sufficiently large with respect to the above values.

The auxiliary capacitor in parallel with the liquid crystal cell may be formed in two ways; that is, as an additional-capacitance type (Ca type) cell or as a storage capacitance type (Cs type) cell.

FIG. 1 shows a pixel layout of a conventional liquid crystal display on which the additional capacitance type storage capacitor is formed and FIG. 2 is a cross-sectional view taken along line II—II of FIG. 1.

In FIG. 1, a single pixel region and portions of adjacent pixel regions surrounding it, are illustrated. In a complete LCD display, rows of a number of gate lines 1 and orthogonal columns of a number of data lines 5a are arranged in a matrix configuration. Thus, a pixel is formed in the regions bounded by these two kinds of lines. In each pixel region, an additional-capacitance type capacitor Ca, a thin film transistor (TFT) as a switching device, a light transmissive portion (aperture area), a transparent pixel electrode 4 and a color filter layer 21 are provided. Gate line 1 and data line 5a are referred to as a scanning signal line and a display signal line, respectively.

As can be seen in FIG. 1, the first electrode 10 of each additional-capacitance type capacitor Ca is formed as a tab-like portion projected into a respective pixel portion from the scanning signal lines 1. Similarly, the gate electrode G of each TFT is also formed as an integral tab-like portion projected into a respective pixel portion from the scanning signal lines 1 (in the opposite direction to the corresponding first electrode of the capacitor). Each TFT system comprises a semiconductor layer 3 formed over a gate electrode G, a tab-like perpendicularly protruding portion of display signal line 5a (drain electrode) adjoining the left end of semiconductor layer 3, a source electrode 5b adjoining the right end of semiconductor layer 3 and a transparent pixel electrode 4. Transparent pixel electrode 4 is comprised of a transparent conductive material such as indium tin oxide (ITO).

All of the scanning signal lines 1, display signal lines 5a, capacitors Ca, TFTs, and pixel electrodes 4 are formed as part of a multilayer structure formed on the inner surface of a rear glass substrate 100, as can be seen in FIG. 2.

The process for forming the LCD having the additional-capacitance type capacitors Ca is explained in more detail as follows. First electrode 10 of each auxiliary capacitor Ca and each scanning signal line 1 are simultaneously formed by appropriately patterning an opaque conductive material (e.g., of aluminum, chromium, molybdenum, or tantalum) deposited on the inner surface of the rear glass substrate 100 via a conventional photolithography process. Thereafter, an insulating layer 2 is formed over the scanning signal lines 1, first electrodes 10 of capacitors Ca and the exposed regions of the inner surface of the rear glass substrate 100 as shown in FIG. 2. Next, the display signal lines 5a and transparent pixel electrodes 4 are separately formed, e.g., by successive photolithography processes. Then, a protective layer 6 is formed over pixel electrodes 4, display signal lines 5a, and the exposed regions of insulating layer 2, to thereby complete the multilayer structure provided on the inner surface of the rear glass substrate 100.

With reference to FIG. 2, the prior art active matrix LCD further includes a front glass substrate 101 having a multilayer structure formed on the inner surface thereof, and oriented parallel to the rear glass substrate 100. For example, a light shielding layer (black) matrix 20 for light shielding is formed on the inner surface of front glass substrate 101. Light shielding layer matrix 20 is formed by appropriately patterning a light-shielding layer via a conventional photolithography process, to define an aperture area occupying most of each pixel electrode 4 arranged on rear glass substrate 100. Thereafter, a color filter layer 21 is formed over light shielding layer matrix 20 and the exposed areas of the inner surface of the front glass substrate 101. The color filter layer 21 includes light transmissive portions 21a disposed in the aperture areas. Next, a protective layer 22 is formed over the color filter layer 21. Then, a transparent electrode 23 is formed over protective layer 22, to thereby complete the multilayer structure provided on the inner surface of the front glass substrate 101.

It can be noted that the conventional active matrix LCD further includes a thin layer of liquid crystal sandwiched between the front glass substrate 101 and the rear glass substrate 100, and disposed in contact with transparent electrode 23 and protective layer 6. Subsequent process steps well-known to those of ordinary skill in the pertinent art are then carried out to fix front glass substrate 101 and rear glass substrate 100 using a conventional sealant (not shown), and the liquid crystal is injected and sealed within the cavity formed therebetween.

In the active matrix LCD of the additional capacitance type, since first electrodes 10 of the additional-capacitance type capacitors and scanning signal lines 1 are simultaneously patterned using the same material, an additional process is unnecessary. Accordingly, the process for making the active matrix LCD can be simplified.

However, based upon the foregoing description of the conventional active matrix LCD, it should also be appreciated that the prior art suffers from certain drawbacks, as follows. Because the first electrode 10 of each capacitor Ca is formed of an opaque metal, and further, because the first electrode 10 of each capacitor Ca overlaps a significant portion of its associated pixel electrode 4, the aperture area of each pixel is significantly reduced by the corresponding overlap area, thereby reducing the aperture ratio thereof.

Moreover, since the display signal lines 5a and pixel electrodes 4 are formed together on the same insulating layer 2, they must be separated by a predetermined distance so as to achieve electrical isolation therebetween. This reduces the aperture area of the LCD and thus lowers the contrast ratio and luminance of the LCD.

Additionally, since the first electrode 10 of the additional capacitance is connected to the scanning signal line 1, i.e. the gate line, the wiring capacitance of the scanning signal line is greatly increased. Therefore, the load is increased when operating the scanning signal line, to increase the propagation delay time of the gate pulse signal, i.e. the gate delay.

FIG. 3 is an equivalent circuit diagram of the LCD device of the conventional additional-capacitance type as shown in FIGS. 1 and 2. In the unit pixel area defined by the scanning signal line 1 and the display signal line 5a, there exist capacitances such as the capacitance (Ccr) formed at the crossing portion of the scanning signal line 1 and the display signal line 5a, the capacitance (Cadd) formed between the pixel electrode 4 and the first electrode 10 of the additional-capacitance type capacitor Ca, the capacitance (Clc) formed between the pixel electrode 4 and the liquid crystal, the capacitance (Cds) formed between the source and drain electrodes of the thin film transistor, the capacitance (Cgs) formed between the gate and source electrodes and the capacitance (Cgd) formed between the gate and drain electrodes.

FIG. 4 is a layout of a pixel of a liquid crystal display which has an independent wiring type storage capacitance type capacitor Cs formed in parallel with the liquid crystal cell, as another prior art method for forming the auxiliary capacitor. FIG. 5 is a cross-sectional view taken along line IV—IV of FIG. 4, and shows only the lower part of the liquid crystal display panel. Here, like reference numerals as those of FIG. 1 and FIG. 2 represent the same elements.

There has been proposed an active matrix LCD of the storage capacitance type which has an additional light shielding layer which reduces the light leakage and has an independent wiring type storage capacitor so as to improve the characteristics of a display (see "High-Resolution 10.3-in Diagonal Multicolor TFT-LCD," M. Tsumura, M. Kitajima, K. Funahata et al., SID 91 DIGEST, pp. 215–218).

In the active matrix LCD disclosed in the above paper, in order to obtain a high contrast ratio and high aperture ratio, a double light shielding layer structure is formed and the storage capacitor is formed by an independent wiring separately formed apart from the gate line, so as to improve the display characteristics of the LCD.

In the structure of the above double light shielding layer, a first light shielding layer is formed on a front glass substrate on which a color filter is provided as in the prior art, and a second light shielding layer is formed on a rear glass substrate on which the TFT is provided. The LCD having such a double light shielding layer structure exhibits an aperture ratio which is improved by 6–20% over the conventional LCD having only the first light shielding layer. Also, the storage capacitor utilizes a common electrode with the gate electrode formed of aluminum whose resistance is only one-tenth that of chromium (Cr). Thereby, the propagation delay characteristics along the scanning signal line is improved.

The LCD having the double light shielding layer structure and the aluminum common electrode still needs much improvement. Also, there is undesirable a reduction of the aperture ratio due to the usage of an opaque metal (aluminum) for forming the electrodes of the storage capacitor associated with each pixel.

Moreover, the process for fabricating the second light shielding layer entails installing a light shielding layer before forming an insulating layer merely for shielding light during the manufacturing of the TFTs, thereby necessitating additional process steps which unduly increase the cost and complexity of the LCD manufacturing process.

As shown in FIG. 4, an independent wiring storage capacitance type capacitor Cs is a structure wherein a transparent, conductive material such as indium-tin oxide (ITO) replaces the opaque metal, e.g., the aluminum, in the above-mentioned conventional TFT-LCD. The light shielding layer structure formed around transparent pixel electrode 4 is not illustrated in FIG. 4 because it is not essential. FIG. 4 shows only part of a large number of pixel portions defined by a large number of scanning signal lines 1 and a large number of display signal lines 5a as shown in FIG. 1. Independent wiring storage capacitance type capacitor Cst is separated from scanning signal lines 1, differently from the additional capacitance type capacitor Ca shown in FIG. 1, so as to be connected with the capacitor Cs in the adjacent pixel portion by an independent wiring 11 formed as a different conductive layer.

As shown in FIG. 4, the LCD having the independent wiring storage capacitance type capacitor utilizes the inversely staggered TFTs as switching devices. If the forming process is observed, each gate electrode G which is formed such that each of scanning signal lines 1 is formed with a tab-like portion projected into each pixel portion, each first electrode 10a of each storage capacitor Cs and each independent wiring 11 which is an extension of the first electrode 10a are formed so as to be parallel to the rear glass substrate of the liquid crystal display panel. Successively, after insulating layer 2 such as with a silicon nitride (SiN) layer is formed on the front surface, a semiconductor layer 3 and a transparent pixel electrode 4 are formed in a predetermined pattern, and then the display signal lines 5a and the source electrodes 5b are formed thereon. Subsequent processes are accomplished by a method conventionally used in the LCD field.

Since the liquid crystal display of the independent wiring storage capacitance type capacitor as shown in FIGS. 4 and 5 utilizes transparent ITO for forming first electrode 10a of storage capacitor Cs, the aperture area does not decrease by as much as that of the opaque electrode type. Meanwhile, since the light shielding layer does not exist on the rear glass substrate of the liquid crystal display panel alongside the pixel electrode, the contrast ratio of the LCD is reduced significantly and an additional process is required for forming first electrodes 10a of storage capacitors Cs. (This process is performed by depositing an additional transparent conductive material such as ITO which is different from the opaque conductive material of the scanning signal lines and then etching the transparent conductive material.) Moreover, the manufacturing yield thereof is disadvantageous since the crossing portions of the wirings are increased when compared to the LCD as shown in FIG. 1.

FIG. 6 is an equivalent circuit diagram of the LCD device of the conventional auxiliary capacitor type as shown in FIGS. 4 and 5. In the unit pixel defined by the scanning signal line 1 and the display signal line 5a, there exist capacitances such as the capacitance (Ccr) formed at the crossing portion of the scanning signal line 1 and the display signal line 5a, the capacitance (Cst) formed between the pixel electrode 4 and the first electrode 10a of the opposing storage capacitor Cs, the capacitance (Clc) formed between the pixel electrode 4 and the liquid crystal, the capacitance (Cds) formed between the source and drain electrodes of the thin film transistor, the capacitance (Cgs) formed between the gate and source electrodes and the capacitance (Cgd) formed between the gate and drain electrodes.

In the LCD of the independent wiring storage capacitance type as shown in FIGS. 4 to 6, the capacitance of the gate wiring (Cin) may be calculated by the following equation (1).

$$Cin = Ccr + Cgs + 1/[(1/Cgd) + \{1/(Clc+Cst)\}] \tag{1}$$

In the meantime, in the LCD of the additional capacitance type as shown in FIGS. 1 to 3, the capacitance of the gate wiring (Cad) may be calculated by the following equation (2).

$$Cad = Cin + 1/[(1/Cst) + \{1/(Clc+Cgs)\}] \tag{2}$$

From the comparison of the above equations (1) and (2), the gate line capacitance of an additional capacitance type LCD is several times as much as that of a storage capacitance type LCD. Therefore, when operating the gate line of the additional capacitance type LCD, the load thereof is increased, which increases the gate delay.

From the above, although the manufacturing process of the additional capacitance type LCD is simplified, obtaining a uniform image is difficult due to the gate delay since the gate wiring capacitance is large. In the meantime, the gate wiring capacitance of the storage capacitance type LCD is small. However, forming the first electrode of the storage capacitor using an opaque metal, which simplifies the manufacturing process thereof, also lowers the aperture ratio significantly. Forming the first electrode of the storage capacitor using a transparent material improves the aperture ratio, but necessitates an additional process. Both the auxiliary capacitor type LCDs have many crossing points of the wiring layers, which increases the possibilities for discontinuity defects or short circuiting of the wiring.

To improve the problems exhibited in the above-mentioned liquid crystal display of the additional capacitance type (FIGS. 1 to 3) and in that of the independent wiring storage capacitance type (FIGS. 4 to 6), S. S. Kim et. al (including one of the present inventors) have described an invention wherein the LCD includes a storage capacitance type capacitor structured with a ring electrode which faces a corresponding transparent pixel electrode and encloses the transparent pixel electrode in a ring, as filed on Aug. 25, 1992 as U.S. patent application Ser. No. 07/934,396 which is now U.S. Pat. No. 5,339,181.

The LCD disclosed in U.S. Pat. No. 5,339,181 will be explained below with reference to FIGS. 7 and 8. Here, the same reference numerals as those of FIGS. 1, 2, 4 and 5 represent the same components.

As can be seen from a comparison of FIG. 7 with FIGS. 1 and 4, the active matrix LCD shown in FIG. 7 is manufactured according to the conventional method except for the fact that the layout of first electrodes 10 of storage capacitors (i.e. storage capacitance type capacitors) Cs associated with each pixel electrode 4 is changed so that the first electrode 10 is arranged in the peripheral region of the pixel electrode 4 to thereby increase the aperture ratio and contrast ratio of the LCD as compared with the conventional LCD. In more detail, the opaque metal layer from which the display signal lines 5a and the first electrodes 10 of storage capacitors Cs are formed is patterned in a manner such that the first electrodes 10 of storage capacitors Cs substantially surround their associated pixel electrodes 4, and preferably, overlap (i.e., underlay) only a peripheral edge portion thereof. As can be seen more clearly in FIG. 8 (taken along line VI—VI of FIG. 7), the first electrode 10 of the capacitor Cs is disposed substantially beneath the matrix of the light shielding layer 20 provided on the inner surface of the front glass substrate 101, and does not extend into the envelope of the aperture area, thereby significantly increasing the aperture ratio compared with conventional active matrix LCDs.

Additionally, the first electrode 10 of each capacitor Cs formed along the periphery of each corresponding pixel electrode 4, serves as an additional light shielding layer, as illustrated in FIG. 8. That is, the first electrode 10 minimizes the amount of leakage light passing through the aperture area of the front glass substrate 101 from the region of the liquid crystal located outside of the envelope of the aperture area.

In the case of the conventional active matrix LCD depicted in FIG. 2, it can be seen that any extraneous light entering the front glass substrate 101 at an angle of incidence greater than $\Theta_1$ is emitted through the aperture area of the front glass substrate 101. In the case of the LCD of U.S. Pat. No. 5,339,181, only extraneous light which enters the front glass substrate at an angle of incidence greater than $\Theta_2$ is emitted through the aperture area of the front glass substrate as illustrated in FIG. 8. Excess light (or "leakage light") which strikes the front glass substrate whose angle is less than the angle of incidence $\Theta_2$ is blocked by first electrode 10 of the adjacent storage capacitor. Thus, relative to the aforesaid prior art active matrix LCDs, the LCD of the U.S. Pat. No. 5,339,181 reduces the amount of leakage light emitted through the aperture area of front glass substrate 101 by an amount which is proportional to the difference between $\Theta_2$ and $\Theta_1$, thereby significantly increasing the contrast ratio.

Meanwhile, the liquid crystal display having the ring type electrode storage capacitor represents an improvement in display characteristics, i.e., a better aperture ratio, increased contrast ratio, etc. However, due to the introduction of foreign matter or in case of a weak insulating film at wiring crossings (the intersection of scanning signal lines 1 and display signal lines 5a), wiring fractures in scanning signal lines 1 and/or short circuits between scanning signal lines 1 and display signal lines 5a may occur, to thereby significantly lower the yield of manufactured liquid crystal displays.

In order to solve the problems of wiring fractures in scanning signal lines 1 and/or short circuits between scanning signal lines 1 and display signal lines 5a without reducing the aperture ratio and the contrast ratio, U.S. Pat. No. 5,517,341 describes an invention wherein each row of adjacent first electrodes of the capacitors are electrically connected together using redundancy connecting conductors or wherein the LCD has duplicated scanning signal lines associated with each pixel and electrically connected to the first electrode of the capacitor.

FIG. 9 shows a pixel layout of a liquid crystal display according to one embodiment of the invention disclosed in the above U.S. Pat. No. 5,517,341. Here, the same reference numerals as those of FIGS. 1 to 8 represent the same components.

Referring to FIG. 9, the liquid crystal display is the same as that having a ring-structured capacitor electrode as shown in FIG. 7 except that a redundancy connecting portion 12 is formed between the first electrodes 10 of the storage capacitors which are formed in each pixel region in a manner such that the first electrodes 10 of storage capacitors Cs substantially surround their associated pixel electrodes 4. Redundancy connecting portions 12 which are connected between the first electrode 10 of each one of the storage capacitors are simultaneously formed with a pattern of the first electrodes 10 and intersects display signal lines 5a with a dielectric film interposed therebetween.

FIG. 10 shows a pixel layout of a liquid crystal display according to another embodiment of the invention disclosed in the above U.S. Pat. No. 5,517,341. Here, the same reference numerals as those of FIGS. 1 to 8 represent the same components.

Referring to FIG. 10, the liquid crystal display is the same as that having a ring-structured capacitor electrode as shown in FIG. 7. The liquid crystal display shown in FIG. 10 is characterized by having its scanning signal lines duplicated as first scanning signal lines 1a and second scanning signal lines 1b as compared with the pixel layout of the liquid crystal display shown in FIG. 7 as described above. A plurality of the scanning signal lines which are each constituted by an electrode pair of a first scanning signal line 1a and a second scanning signal line 1b are arranged at predetermined intervals. Here, the pixel portions are defined within first and second scanning signal lines 1a and 1b and display signal lines 5a.

Moreover, as compared with FIG. 7, the thin film transistor TFT, employed as a switching device, is not formed on an integral protruding tab-like portion of a corresponding scanning signal line 1 but rather is formed on first scanning signal line 1a. That is, a gate electrode of the thin film transistor is rotated 90° so as to be consistent with first scanning signal line 1a, thereby to maximize the aperture ratio of the liquid crystal display.

In the above liquid crystal display as shown in FIGS. 9 and 10, the redundancy connecting portions for connecting the first electrodes of the capacitors or the two-fold scanning signal lines are formed by a simple change of the pattern layout without requiring an additional process. The first electrode is formed to be a ring-type which can utilize a maximum pixel area, thereby enhancing the aperture ratio of the LCD. Since the first electrode of the storage capacitor serves as an additional light shielding layer, the contrast ratio is greatly enhanced.

Additionally, a redundancy connecting portion is formed for connecting the first electrodes of the capacitors to each other, or the scanning signal lines are doubled, so that disconnection and shorting defects of the scanning signal lines in the crossing portions of the wirings can be decreased and repaired. For example, referring to FIG. 10, a disconnection defects occurs with respect to one display signal electrode 5a when disconnections occur at the crossing portions with of first and second scanning signal electrodes 1a and 1b, but not when a disconnection occurs either with first scanning signal electrode 1a or with second scanning signal electrode 1b. In the meantime, when a short circuit occurs between either of the scanning signal electrodes 1a and 1b and the display signal electrode 5a, the shorting defects may be repaired by cutting the signal line on both sides of the crossing portion where the short circuit has occurred. Since the scanning signal electrode is duplicated, the shorting defect may be easily repaired.

SUMMARY OF THE INVENTION

It is a first object of the present invention to provide a liquid crystal display having an independent wiring storage capacitance type wherein the display characteristic is improved.

It is a second object of the present invention to provide a liquid crystal display having a ring-structured storage capacitor of an independent wiring type wherein disconnection and/or shorting defects are reduced.

It is a third object of the present invention to provide a method for manufacturing a liquid crystal display which is suitable for manufacturing the above liquid crystal display devices.

It is a fourth object of the present invention to provide a liquid crystal display wherein the RC time constant is reduced to obtain a uniform image.

It is a fifth object of the present invention to provide a method for manufacturing a liquid crystal display which is suitable for manufacturing the above liquid crystal display device.

In order to accomplish the first and second objects of the present invention, there is provided a liquid crystal display device comprising:

a transparent substrate;

a plurality of scanning signal lines and intersecting display signal lines arranged in a matrix configuration on a surface of the transparent substrate, to thereby define a plurality of pixel regions each bounded by a pair of scanning signal lines and a pair of display signal lines;

a pixel electrode in each pixel region;

a switching device in each pixel region and connected with a corresponding display signal line and the pixel electrode; and a ring-type first electrode disposed within each pixel region so as to face the corresponding pixel electrode and surround the pixel electrode, for forming a storage capacitance type capacitor with the pixel electrode, the first electrodes of adjacent pixel portions being connected to each other by at least one wiring connecting portion, the first electrode being driven independently from the scanning signal lines and the display signal lines.

The first electrodes of the storage capacitors preferably are comprised of the same material as the bonding pads for connecting the scanning signal lines and the display signal lines to an outer driving circuit and simultaneously patterned when forming the bonding pads.

According to one embodiment of the present invention, the first electrodes of the storage capacitors and the scanning signal lines are comprised of the same material and simultaneously patterned. The patterned first electrodes of the storage capacitors and the scanning signal lines may be formed by using an opaque conductive metal such as aluminum, chromium, molybdenum or tantalum. The first electrodes of the storage capacitors and the scanning signal lines may be formed so as to have a stacked structure comprised of at least two metals.

The connecting portion for connecting the first electrodes of the adjacent storage capacitors is formed so as to cross the display signal lines. Preferably, the connecting portions between two first electrodes of adjacent capacitors are duplicated.

According to another embodiment of the present invention, the first electrode of the storage capacitors and the scanning signal lines are formed from different conductive layers. The wiring connection portion is preferably formed so as to cross the scanning signal lines. The first electrodes of the storage capacitors and the scanning signal lines are isolated from each other by interposing an insulating layer therebetween. The connecting portions between first electrodes of the adjacent two capacitors are preferably duplicated.

According to one embodiment of the present invention, the switching device is a thin film transistor comprising:

a gate electrode formed of a portion of each scanning signal line;

a drain electrode formed of a projecting portion of each display signal line;

a source electrode overlapping a portion of each pixel electrode; and a semiconductor layer formed on an insulating layer on the gate electrode, and patterned to connect the drain electrode to the source electrode.

The thin film transistor is preferably an inversely staggered type formed on a crossing point of the scanning signal lines and the display signal lines. The gate electrode, drain electrode and semiconductor layer of the thin film transistor are preferably formed outside the boundary of the pixel electrode.

Preferably, the source electrode of the thin film transistor overlays a portion of the first electrode of the storage capacitor. The first electrode of the storage capacitor partially overlaps along the overall periphery of the pixel electrode. One portion of a periphery of the first electrode of the storage capacitor overlaps one portion of the pixel electrode by a predetermined width without abrupt steps.

In another embodiment of the present invention, the switching device is a thin film diode.

The first electrode of the storage capacitor and the scanning signal lines are preferably formed on a first horizontal plane and the pixel electrode and the display signal lines are formed on a second horizontal plane, the first and second horizontal planes being spaced apart from each other by an insulating layer interposed therebetween.

Also, the present invention provides a liquid crystal display comprising:

a front glass substrate having inner and outer surfaces;

a rear glass substrate having inner and outer surfaces, parallel the front glass substrate and separated therefrom by a predetermined distance to allow its inner surface to oppose the inner surface of the front glass substrate;

a plurality of scanning signal lines and intersecting display signal lines arranged on the inner surface of the rear glass substrate in matrixes for defining a plurality of pixel areas each bounded by a pair of the scanning signal lines and a pair of the display signal lines;

a pixel electrode within each pixel area;

a switching device within each pixel area for connecting a corresponding one of the display signal lines to the pixel electrode;

a ring type first electrode arranged within each pixel area and oppositely enclosing the pixel electrode to form a capacitor in conjunction with the pixel electrode, the first electrodes of adjacent pixel areas being connected by at least one wiring connecting portion and the first electrode being driven independently from the scanning signal lines and the display signal lines;

a light-shielding layer matrix on the inner surface of the front glass substrate aligned with each pixel area for defining a light-transmitting aperture area therein;

a color filter layer on the inner surface of the front glass substrate and including a light transmitting area covering the light-transmitting aperture area and the light-shielding layer; and a transparent electrode formed on the color filter layer.

A first protective layer is preferably sandwiched between the color filter layer and the transparent electrode and a second protective layer covers the inner surface of the rear glass substrate.

The border of the aperture area defined by the periphery of the light-shielding layer of each pixel region is substantially in vertical alignment with an inner periphery of the first electrode of the storage capacitor, whereby the first electrode of the storage capacitor functions as a secondary light shielding layer for decreasing light leakage, being other than the light permitted to be passed through the aperture area. Light entering the aperture area via the rear glass substrate defines a virtual aperture area, and the first electrodes of the storage capacitors do not extend into the virtual aperture area.

To achieve the third object of the present invention, there is provided a method for manufacturing a liquid crystal display having a transparent substrate; a plurality of scanning signal lines and intersecting display signal lines arranged in a matrix configuration on a surface of the transparent substrate to thereby define a plurality of pixel regions each bounded by a pair of scanning signal lines and a pair of display signal lines; a pixel electrode in each pixel region; a switching device in each pixel region; and a first electrode within each pixel region being independent from the scanning signal lines and the display signal lines, the method comprising the steps of:

forming a first metal layer on a transparent substrate;

patterning the first metal layer to form bonding pads for connecting inner elements to an outer circuit;

forming a second metal layer on the resultant structure having the bonding pads thereon;

patterning the second metal layer to form a plurality of scanning signal lines in a regular arrangement, a first electrode of a storage capacitance type capacitor disposed in each pixel area, and at least one wiring connecting portion for connecting first electrodes of adjacent storage capacitance type capacitors, the first electrodes being independent of the scanning signal lines and the display signal lines;

successively forming an insulating layer and a semiconductor layer on the surface of the resultant structure;

patterning the semiconductor layer to leave the semiconductor layer only around a portion of the scanning signal lines;

forming a transparent conductive layer on the surface of the resultant structure;

patterning the transparent conductive layer to form a pixel electrode opposed to the first electrode of the storage capacitance type capacitor along a periphery thereof;

forming a third metal layer on the resultant structure; and patterning the third metal layer to form the plurality of display signal lines regularly arranged while intersecting the scanning signal lines, and source and drain electrodes of a thin film transistor on the semiconductor layer.

According to one embodiment of the present invention, the scanning signal lines and the first electrodes of the storage capacitance type capacitors are preferably formed simultaneously by patterning the second metal layer. In such a case, the wiring connection portion is formed so that the first electrodes of the storage capacitors are connected in parallel with the scanning signal lines.

According to another embodiment of the present invention, the scanning signal lines and the first electrodes of the storage capacitance type capacitors may be formed by a separate patterning process.

In the present invention, the wiring connection portions may be formed so as to cross the scanning signal lines.

Further, the third object of the present invention can be achieved by providing a method for manufacturing a liquid crystal display having a transparent substrate; a plurality of scanning signal lines and intersecting display signal lines arranged in a matrix configuration on a surface of the transparent substrate to thereby define a plurality of pixel regions each bounded by a pair of scanning signal lines and a pair of display signal lines; a pixel electrode in each pixel region; a switching device in each pixel region; and a first electrode within each pixel region being independent from the scanning signal lines and the display signal lines, the method comprising the steps of:

forming a first metal layer on a transparent substrate;

patterning the first metal layer to form bonding pads for connecting inner elements to an outer circuit and to also form a plurality of first electrodes of a storage capacitance type capacitor in each pixel area and to form at least one wiring connecting portion for connecting first electrodes of adjacent storage capacitance type capacitor, the first electrode being independent from the scanning signal lines and the display signal lines;

forming a second metal layer on the resultant structure having the bonding pads and the first electrodes of the capacitors thereon;

patterning the second metal layer to form the scanning signal lines at regular intervals;

successively forming an insulating layer and a semiconductor layer on the surface of the resultant structure;

patterning the semiconductor layer to leave the semiconductor layer only around a portion of the scanning signal lines;

forming a transparent conductive layer on the surface of the resultant structure;

patterning the transparent conductive layer to form a pixel electrode opposed to the first electrode of the storage capacitance type capacitor along a periphery thereof;

forming a third metal layer on the resultant structure; and patterning the third metal layer to form the plurality of display signal lines regularly arranged and intersecting the scanning signal lines, and to form source and drain electrodes of a thin film transistor on the semiconductor layer.

To achieve the fourth object of the present invention, there is provided liquid crystal display device comprising:

a transparent substrate;

a plurality of first scanning signal lines and an intersecting plurality of display signal lines arranged in a matrix configuration on the surface of the transparent substrate, to thereby define a plurality of pixel regions each bounded by a pair of first scanning signal lines and a pair of display signal lines;

a pixel electrode in each pixel region;

a switching device in each pixel region and connected with a corresponding display signal line and the pixel electrode of the respective pixel region;

a first electrode of an additional capacitance type capacitor within each pixel region, for forming an additional capacitance type capacitor in conjunction with the pixel electrode thereof and arranged so as to face a portion of each pixel electrode with an insulating layer interposed therebetween;

a first electrode of a storage capacitance type capacitor within each pixel region formed by interposing an insulating layer, for forming a storage capacitance type capacitor in conjunction with the pixel electrode thereof and arranged so as to face a portion of each pixel electrode, the first electrode being independent from the scanning signal lines; and a plurality of first independent wires connecting the first electrodes of adjacent storage capacitance type capacitors.

The first electrode of the storage capacitance type capacitor and the first electrode of the additional capacitance type capacitor are preferably formed using the same material as the scanning signal lines. In a preferred embodiment of the present invention, the first electrode of the storage capacitance type capacitor is comprised of a conductive transparent material.

According to a preferred embodiment of the present invention, the scanning signal lines are formed so as to have portions protruding into the pixel regions so that the protruding portions partially overlap the pixel electrodes to form the first electrodes of the additional capacitance type capacitors.

According to one embodiment of the present invention, the first electrode of the storage capacitance type capacitor and the first electrode of the additional capacitance type capacitor are formed of a single wiring type.

According to another embodiment of the present invention, the first electrode of the additional capacitance capacitor is formed in a ring type surrounding the peripheral region of the pixel electrode, the first electrode of the additional capacitance type capacitor being formed between the scanning signal line for driving the pixel electrode of an adjacent pixel region and the first electrode of the storage capacitance capacitor. Preferably, at least one redundancy connection portion for connecting the first electrode to the adjacent first electrode is formed.

According to still another embodiment of the present invention, the first electrode of the storage capacitance type capacitor is formed in a ring type surrounding the peripheral region of the pixel electrode, the first electrode of the storage capacitance type capacitor being formed between the scanning signal line and the first electrode of the additional capacitance type capacitor. In such a case, a second independent wiring for connecting the first electrodes of the storage capacitance type capacitors is preferably formed.

The first electrode of the storage capacitance type capacitor may be formed using the same material as that of bonding pads formed on the transparent substrate for connecting the scanning signal lines to an outer driving circuit.

In one preferred embodiment of the present invention, the ratio of the storage capacitance with respect to the additional capacitance is greater than 80:20.

The present invention provides a liquid crystal display device comprising:

a transparent substrate;

a plurality of first scanning signal lines and display signal lines arranged in a matrix configuration on a surface of the transparent substrate, to thereby define a plurality of pixel regions each bounded by a pair of first scanning signal lines and a pair of display signal lines;

a pixel electrode in each pixel region;

a switching device in each pixel region and connected with a corresponding display signal line and the pixel electrode;

a first electrode of an additional capacitance type capacitor disposed within the pixel region so as to face the pixel electrode, for forming an additional capacitor with the pixel electrode with an insulating layer interposed therebetween, the first electrode of the additional capacitance type capacitor being formed in a ring shape which surrounds the peripheral region of the pixel electrodes;

at least one redundancy connection portion for connecting the first electrodes of the additional capacitance type capacitors of adjacent pixel regions;

a first electrode of a storage capacitance type capacitor disposed within the pixel region so as to face the pixel electrode with an insulating layer disposed therebetween, for forming a storage capacitor with the pixel electrode, the first electrode being independent from the scanning signal lines, the first electrode of the storage capacitance type capacitor being formed in a ring shape which surrounds the peripheral region of the pixel electrode, the first electrode of the storage capacitance type capacitor being formed between the corresponding scanning signal line and the first electrode of the additional capacitance;

a first independent wiring connecting the first electrodes of the storage capacitance type capacitors of adjacent pixel regions; and a second independent wiring for connecting the first electrodes of the storage capacitance type capacitors of adjacent pixel regions.

Also, the present invention provides a liquid crystal display comprising:

a front glass substrate having inner and outer surfaces;

a rear glass substrate having inner and outer surfaces, parallel the front glass substrate and separated therefrom by a predetermined distance to allow its inner surface to oppose the inner surface of the front glass substrate;

a plurality of scanning signal lines and display signal lines arranged on the inner surface of the rear glass substrate as matrixes for defining a plurality of pixel areas each bounded by means of a pair of the scanning signal lines and a pair of the display signal lines;

a pixel electrode within the pixel area;

a switching device within the pixel area for connecting a corresponding display signal line to the pixel electrode;

a first electrode of an additional capacitance type capacitor disposed within the pixel region so as to face a portion of the pixel electrode with an insulating layer interposed therebetween, for forming an additional capacitance type capacitor;

a first electrode of a storage capacitance type capacitor disposed within the pixel region so as to face a portion of the pixel electrode with an insulating layer interposed therebetween, for forming a storage capacitance type capacitor with the pixel electrodes, the first electrode being independent from the scanning signal lines;

a light-shielding layer matrix formed on the inner surface of the front glass substrate and aligned with each pixel area for defining a light-transmitting aperture area;

a color filter layer on the inner surface of the front glass substrate and including a light transmitting area covering the light-transmitting aperture area and the light-shielding layer;

a transparent electrode formed on the color filter layer; and a liquid crystal layer between the front and rear glass substrate.

To achieve the fifth object of the present invention, there is provided a method for manufacturing a liquid crystal display having a liquid crystal display having a transparent substrate; a plurality of scanning signal lines and intersecting display signal lines arranged in a matrix configuration on a surface of the transparent substrate to thereby define a plurality of pixel regions each bounded by a pair of scanning signal lines and a pair of display signal lines; a pixel electrode in each pixel region; a switching device in each pixel region; and a first electrode within each pixel region being independent from the scanning signal lines and the display signal lines, the method comprising the steps of:

forming a first metal layer on the transparent substrate;

patterning the first metal layer to form bonding pads for connecting inner elements to an outer circuit;

forming a second metal layer on the resultant structure having the bonding pads thereon;

patterning the second metal layer to form the scanning signal lines in a regular arrangement, a first electrode of additional capacitance type capacitor within the pixel region so as to face a portion of the pixel electrode, for forming an additional capacitance type capacitor with an insulating layer interposed therebetween and a first electrode of a storage capacitance type capacitor disposed within the pixel region so as to face a portion of the pixel electrode, for forming storage capacitors with the pixel electrodes with the insulating layer interposed therebetween;

successively forming an insulating layer and a semiconductor layer on the surface of the resultant structure;

patterning the semiconductor layer to leave the semiconductor layer only around a portion of the scanning signal lines;

forming a transparent conductive layer on the surface of the resultant structure;

patterning the transparent conductive layer to form a pixel electrode to oppose to the first electrode of the storage capacitor along a periphery thereof; and forming a third metal layer on the resultant surface;

patterning the third metal layer to form the plurality of display signal lines regularly arranged while intersecting the scanning signal lines, and source and drain electrodes of a thin film transistor on the semiconductor layer.

According to the present invention, the first electrodes of the capacitor can be formed by a simple change of the pattern when forming the scanning signal lines or when forming the bonding pads without requiring an additional process, to thus simplify the process. Forming the first electrode to be a ring-type electrode which can utilize the maximum pixel area, enhances the aperture ratio of the LCD. Furthermore, since the first electrode of the storage capacitor serves as an additional light shielding layer, the contrast ratio and the effectiveness of the light usage are greatly enhanced. Further, forming the first electrodes of the storage capacitance type capacitors in an independent wiring type improves the degree of freedom concerning the selection of the driving pulse signal of the liquid crystal display, and it reduces the R-C delay. Additionally, duplicating the connecting portions for connecting the first electrodes of the capacitors to each other, can decrease and facilitates the repair of defects of disconnection and shorting of the driving lines for the first electrodes occurring in the wiring crossing portions of the wirings, thereby greatly enhancing the yield of manufactured LCDs.

Further, in a liquid crystal display having the first electrodes of the additional capacitance type and the first electrodes of the storage capacitance type according to the present invention, the gate wiring capacitance is decreased when compared to the liquid crystal display having only the additional capacitance type capacitor so as to reduce the RC time constant.

BRIEF DESCRIPTION OF THE DRAWINGS

Further features and advantages will become more apparent from the following and more particular description of the preferred embodiment of the invention as illustrated in the accompanying drawings in which the same reference characters generally refer to like parts throughout the views, and in which.

DESCRIPTION OF THE PREFERRED EMBODIMENTS

Hereinafter, the present invention will be explained in detail with reference to the accompanying drawings.

Figure 11:
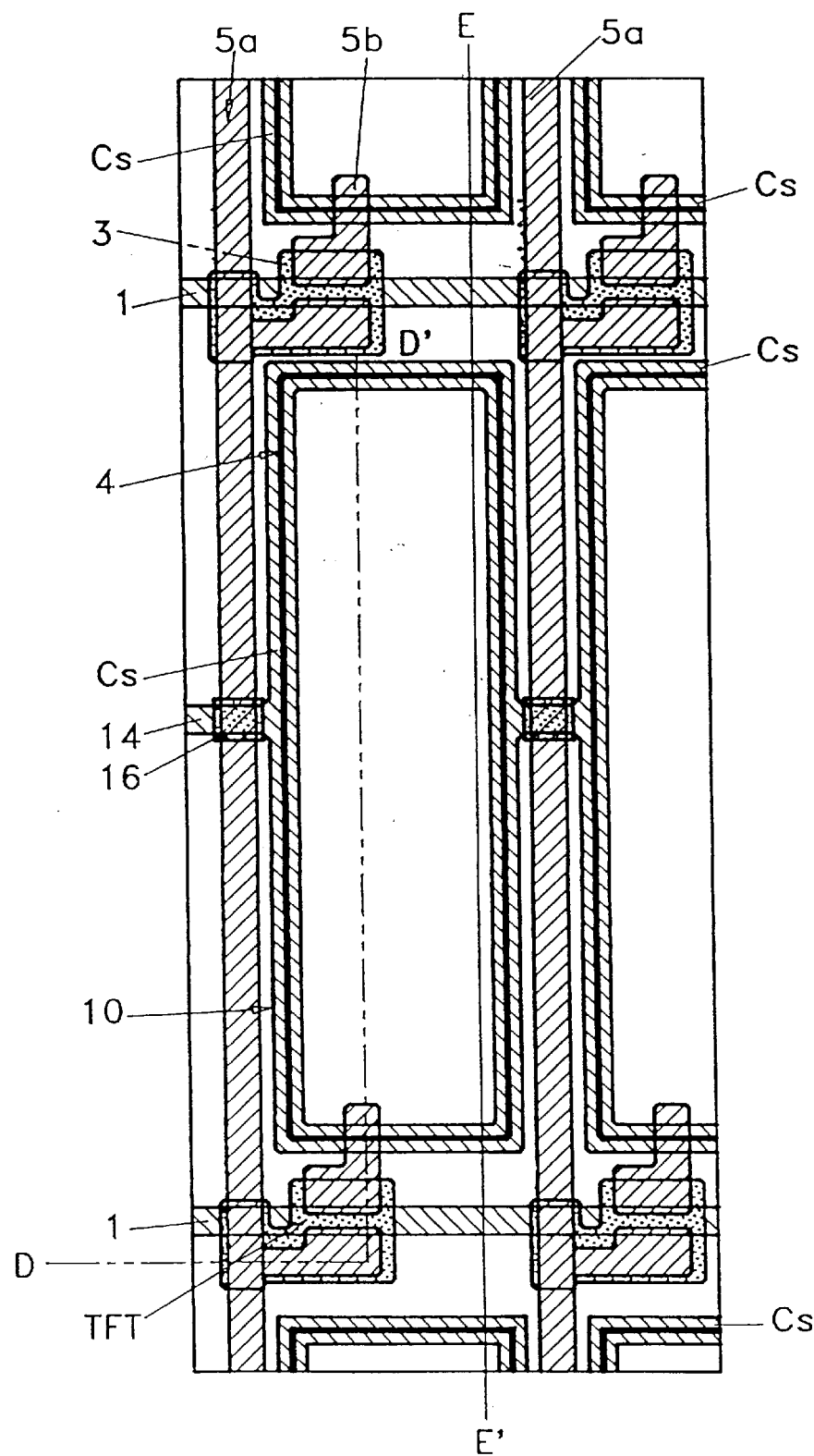
FIG. 11 shows a pixel layout of a liquid crystal display according to a first embodiment of the present invention.

FIG. 11 shows a pixel layout of a liquid crystal display according to a first embodiment of the present invention. Here, the same reference numerals as in the foregoing drawings indicate the same components as those in the foregoing drawings.

In FIG. 11, a single pixel region and portions of adjacent pixels surrounding it, are illustrated. In a complete LCD, rows of a number of scanning signal lines 1 and orthogonal columns of a number of display signal lines 5a are arranged in a matrix configuration. Thus, a pixel is formed in the regions bounded by these two kinds of lines. In each pixel region, a storage capacitor Cs, a thin film transistor (TFT) as a switching device, a light transmissive portion (aperture area), a transparent pixel electrode 4 and a color filter layer 21 (FIG. 13) are provided. As can be seen in FIG. 11, a first electrode 10 of storage capacitor Cs (as a storage capacitance type capacitor) is independently formed without being connected to scanning signal lines 5a so that it surrounds a pixel electrode 4 in each pixel region. Further, the adjacent first electrodes 10 in adjacent pixel regions are connected with each other via the connection portions 14 in an independent wiring type and are driven by another driving circuit different from that for driving the scanning signal lines 1. Here, display signal line 5a is electrically isolated from wiring connection portion 14 by interposing an insulating layer at a wiring crossing portion 16 where display signal line 5a crosses the wiring connection portion 14 between the adjacent first electrodes 10 of the storage capacitors.

In the meantime, an inversely staggered TFT using the scanning signal line 1 as a gate electrode is formed on scanning signal line 1 as a switching device for applying an electrical signal to the pixel electrode 4 via display signal line 5a, so that the pixel area is maximized as much as possible. Instead of the inversely staggered TFT, a thin film diode (TFD), for example, a metal insulator metal (MIM) diode having two terminals, may be used.

Figure 12:
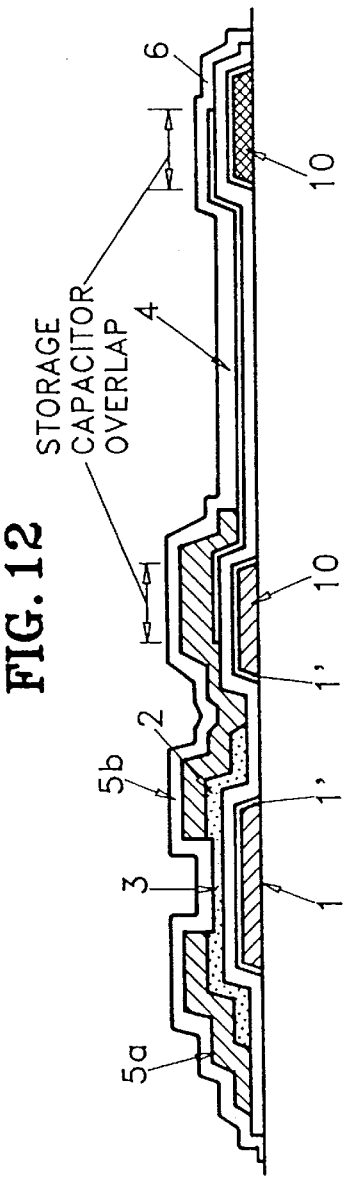
FIG. 12 is a cross-sectional view taken along line D–D' of FIG. 11.

FIG. 12 is a cross-sectional view taken along line D–D' of FIG. 11. With reference to FIGS. 11 and 12, one embodiment of a method for manufacturing a liquid crystal display according to the present invention will be explained below.

First, after preparing a rear glass substrate (not shown) of the liquid crystal display, a pad metal layer is formed and then patterned to form bonding pads (not shown in FIG. 12) for bonding display signal lines 5a and scanning signal lines 1 to a driving circuit. Here, the pad metal layer is formed by depositing chromium to a thickness of approximately 2,000 Å. Thereafter, aluminum is deposited to a thickness of not more than 4,000 Å on the front surface of the rear glass substrate, to form a metal layer, which is patterned to simultaneously form scanning signal lines 1 and first electrodes 10 of the storage capacitors. The first electrode 10 of each storage capacitor, as shown in FIG. 11, is formed as a ring-type structure where the first electrode 10 is sufficiently extended to the edge of the pixel region so as to utilize a maximum pixel region. Simultaneously, wiring connecting portions 14 are also formed so as to be connected between the first electrodes 10 of the adjacent capacitors. Here, each wiring connection portion 14 may be formed at the middle portion of first electrode 10 as shown in FIG. 11 or at the edge portion thereof.

For simplifying the manufacturing process, first electrodes 10 of the storage capacitors may be formed by using the same material as the pad material. That is, after forming the pad metal layer, the first electrodes 10 are simultaneously formed when patterning the pad metal layer. Alternatively, first electrodes 10 of the storage capacitors may be formed via a different step from the step for forming the scanning signal lines 1, by using a different metal from that used for scanning signal lines 1.

Here, since first electrode 10 of the capacitor serves as a light shielding layer described hereinafter, it should be comprised of an opaque conductive material. First electrode 10 may be formed in a multilayer structure or by using an alloy so far as it comprises an opaque conductive material.

Successively, when scanning signal lines 1 or first electrodes 10 are made of aluminum, using an anodic oxide method, surfaces of the electrodes can be covered by an aluminum oxide film ($Al_2O_3$) whose thickness is not more than 2,000 Å, to enhance the electrical characteristics in the pixel electrode 4, crossing portion 16 and in the TFT.

Then, using a chemical vapor deposition (CVD) method, an insulating layer 2 comprising silicon nitride ($SiN_x$) and a semiconductor layer 3 comprising an amorphous hydride silicon (a-Si:H) are formed to thicknesses of about 3,000 Å or less and 2,000 Å or less, respectively. At this time, a-Si:H doped with an N-type impurity ($n^+$ a-Si:H) is deposited to form an ohmic layer having a thickness of approximately 500 Å on the previously deposited a-Si:H. Thereafter, as shown in FIG. 11, the semiconductor layer 3 is patterned so as to define an area in which the switching devices will be formed on scanning signal lines 1 or their nearby portions.

Successively, the insulating layer 2 on the bonding pads (not shown) is removed, and a transparent conductive material, e.g., ITO is deposited to a thickness of about 500 Å or less via a sputtering method, and patterned to thereby form pixel electrodes 4. At this time, each pixel electrode 4 is patterned to overlap the first electrode 10 of the storage capacitor formed in the foregoing step by a predetermined width, with the insulating layer 2 being interposed therebetween. A capacitor is formed between the first electrode 10 of the storage capacitor and the pixel electrode 4 on each pixel region by interposing the insulating layer 2 as a dielectric material therebetween, so that a voltage signal input through display signal line 5a is maintained for a predetermined time period until the succeeding input signal arrives.

Then, chromium and aluminum are successively deposited on the whole surface of the substrate to a thicknesses of about 500 Å or less and 5,000 Å or less, respectively, via a sputtering method, and then patterned to form display signal lines 5a, sources 5b and the drain electrodes of the TFTs. Thereafter, a protective layer 6 comprising silicon nitride is formed on the whole surface of the substrate to a thickness of about 4,000 Å via a CVD method. Hence, fabrication of the lower substrate of the LCD is thereby completed.

Figure 13:
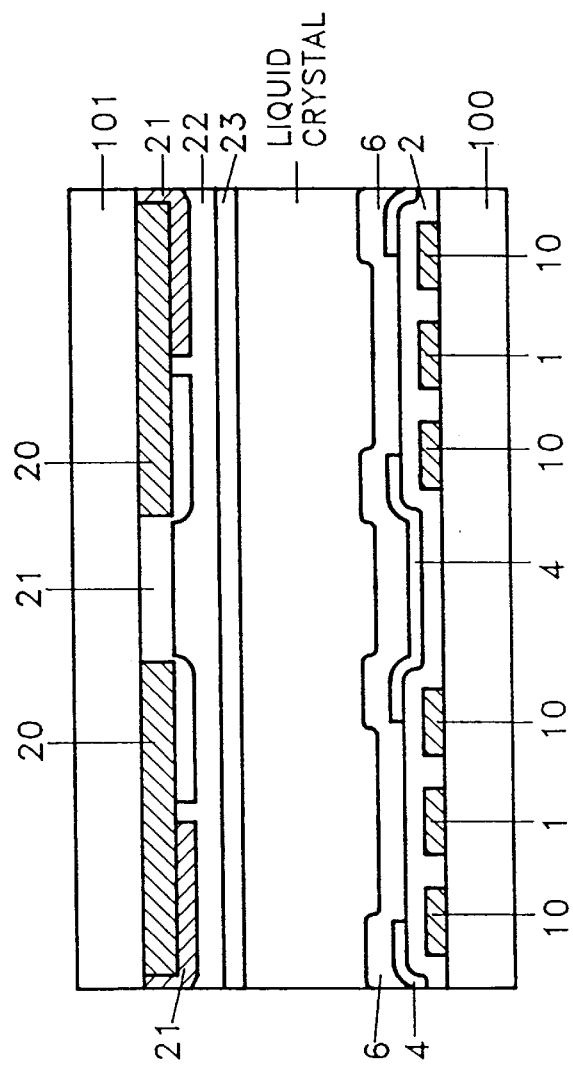
FIG. 13 is a cross-sectional view taken along line E–E' of FIG. 11.

FIG. 13 is a cross-sectional view taken along line E–E' of FIG. 11. The lower panel of the LCD includes scanning signal lines 1 and the first electrodes 10 of the storage capacitors formed on the same horizontal plane on a rear glass substrate 100, a transparent insulating layer 2 formed on the rear glass substrate 100 having the scanning signal lines 1 and the first electrodes 10 already formed thereon, a pixel electrode 4 formed in each pixel region so as to partially overlap the associated first electrode 10 of the associated capacitor to a predetermined extent, and a protective layer 6 formed thereon. Of course, on protective layer 6, an orientation layer (not shown) is formed in a subsequent step for the orientation of the liquid crystal, which is conventional in the LCD art.

In the meantime, the upper panel of the LCD is formed in such a manner that, after the aperture area of the LCD is defined by forming a light shielding layer 20 on the inner surface of the transparent front glass substrate 101 as matrices along the periphery of each pixel area. The light shielding layer 20 and exposed aperture area are covered with a color filter layer 21, and a conventional protective layer 22 and transparent upper common electrode 23 are successively formed thereon, thereby completing the multilayer structure.

The above-described lower and upper panels of the LCD are supported by certain supporting columns, and liquid crystal is injected between them. The panels are then seated, thereby completing the LCD.

According to the LCD as shown in FIGS. 11 to 13, the first electrodes 10 of the capacitors formed on the rear glass substrate perform the role of a secondary light shielding layer together with the first light shielding layer 20 formed on the front glass substrate 101. Therefore, light leakage is reduced to thereby improve the contrast ratio, which resultantly improves the display characteristics of the LCD.

Figure 14:
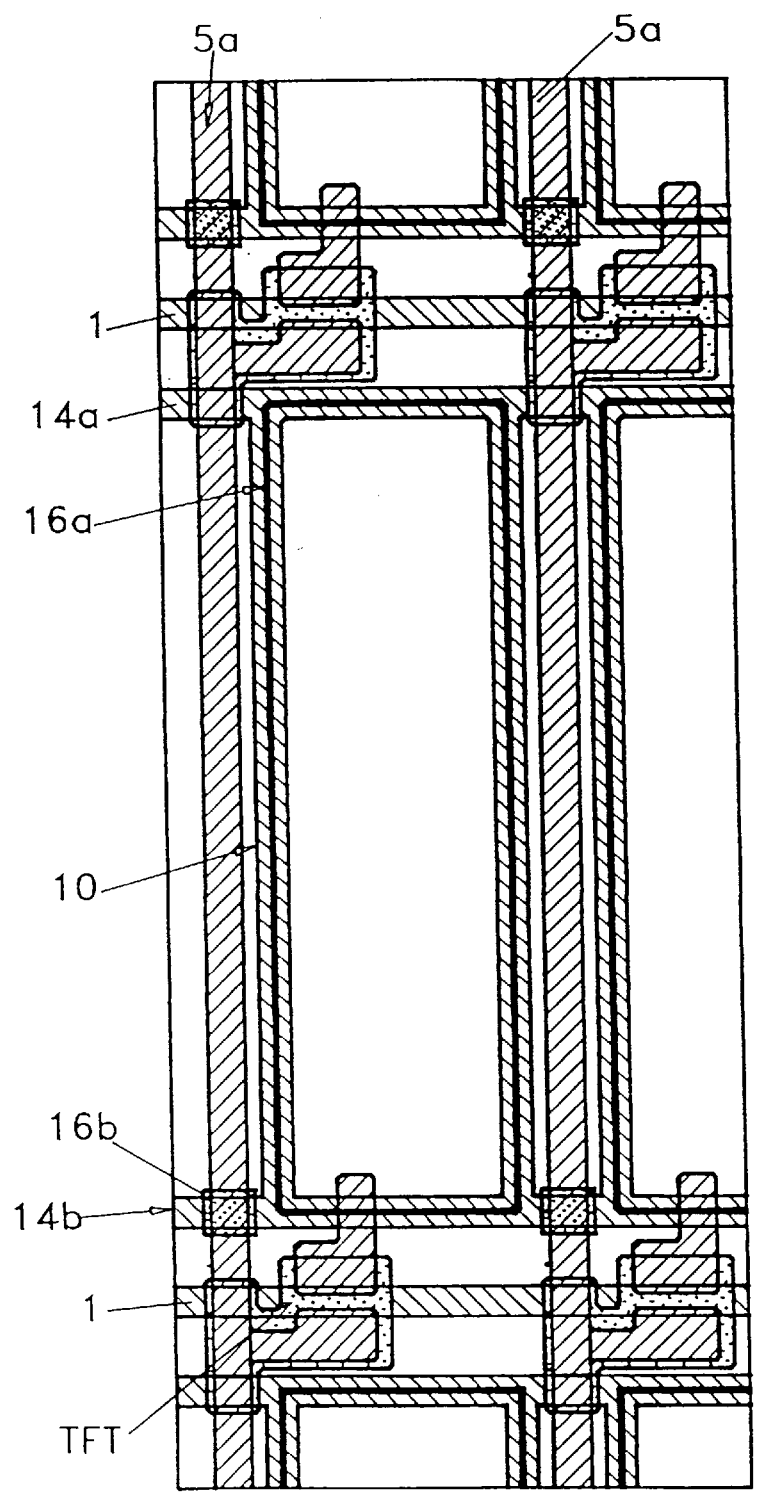
FIG. 14 shows a pixel layout of the liquid crystal display according to a second embodiment of the present invention.

FIG. 14 shows a pixel layout of a liquid crystal display according to a second embodiment of the present invention. The liquid crystal display as shown in FIG. 14 is the same as that shown in FIGS. 11 to 13 except that the connection portion between the first electrodes 10 of the adjacent capacitors is duplicated into first and second connection portions 14a and 14b when compared with the LCD shown in FIGS. 11 to 13.

Referring to FIG. 11, the wiring crossing portion 16 where the wiring connection portion 14 for connecting the first electrodes 10 of the adjacent storage capacitors crosses display signal line 16 is apt to be disconnected or the wiring connection portion 14 becomes short-circuited with the display signal line 16 due to the inclusion of foreign matter into the insulating layer 2 disposed therebetween or due to a poor step coverage of the metal layer forming the same, which deteriorates the manufacturing yield. The liquid crystal display as shown in FIG. 14 aims to overcome this problem.

Further, in the liquid crystal display as shown in FIG. 14, due to the duplication of the wiring connection portions 14a and 14b, wiring crossing portions 16a and 16b are also increased in number to thereby increase the wiring resistance and the parasitic capacitance. This problem can be solved by equalizing the overall line width (sum of line widths) of the first and second wiring connection portions 14a and 14b with the line width of the wiring connection portion 14 in FIG. 11.

The liquid crystal display as shown in FIG. 14 can be manufactured in the same manner as explained with reference to FIGS. 11 to 13 except that when forming first electrodes 10 of the storage capacitors in the ring-type structure, first and second wiring connecting portions 14a and 14b are also formed so as to be connected between first electrodes 10 of adjacent capacitors.

Figure 15:
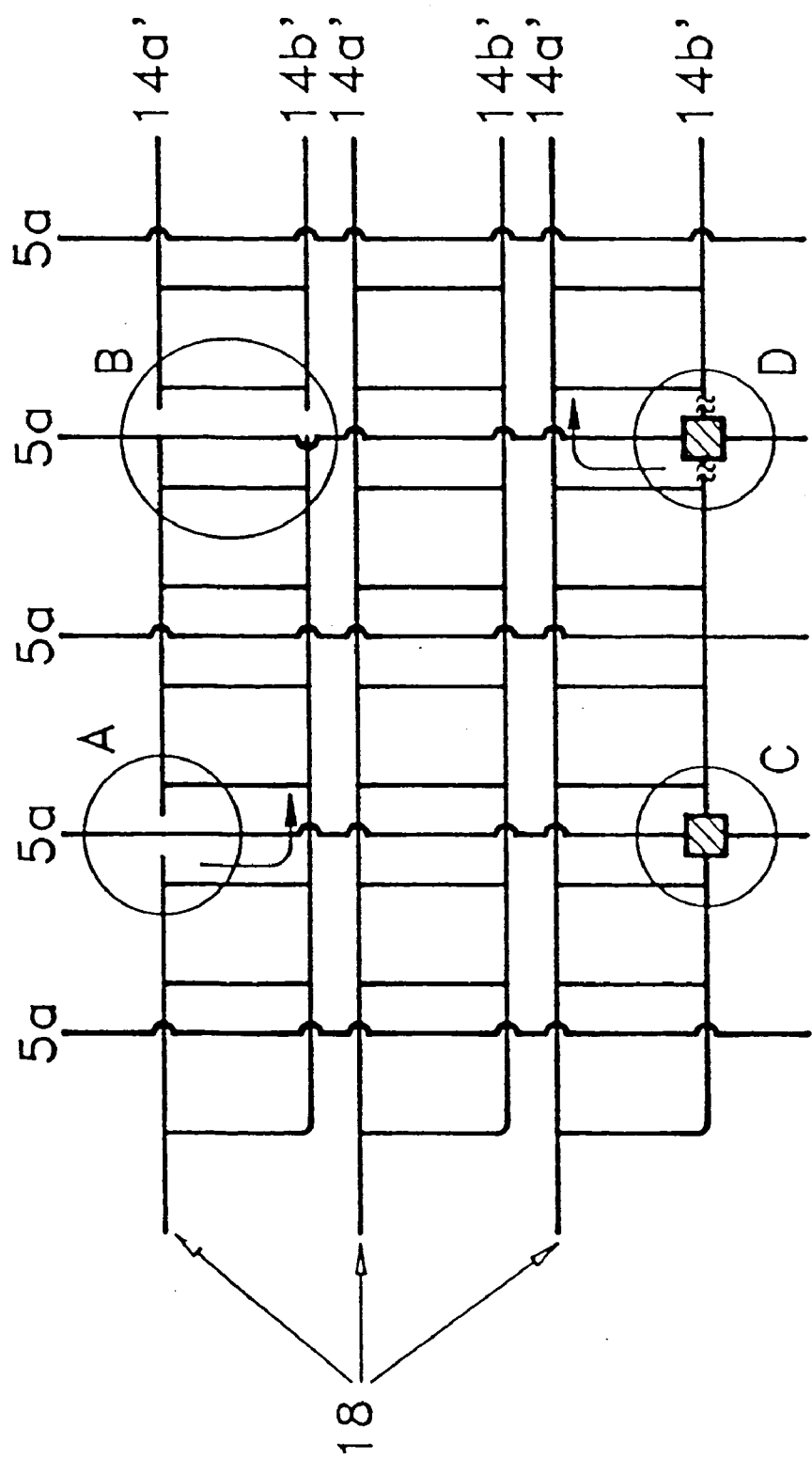
FIG. 15 is a schematic diagram showing an operational principle for explaining the effect of the above second embodiment of the present invention.

FIG. 15 is a schematic diagram showing an operational principle for explaining the effect of the present invention, which illustrates how the two-fold wiring connection portions 14a and 14b can repair defects such as disconnections and shorting occurring in the crossing portions of the first and second wiring connection portions 14a and 14b and display signal lines 5a.

Here, a reference numeral 18 designates a single wiring for connecting the first electrode of the storage capacitor to the driving IC circuit (not shown). Reference numerals 14a' and 14b' designate the two-fold lines for driving the first electrodes of the storage capacitors connected by first and second wiring connection portions 14a and 14b, respectively. An arrow designates signal current flow when only one of first and second wiring connection portions 14a and 14b is disconnected or short-circuited, and reference numerals 5a designate the display signal lines. In a portion A, first wiring connection portion 14a is disconnected at the crossing portion of a first wiring connection portion 14a and a display signal lines 5a. In a portion B, both first and second wiring connection portions 14a and 14b are disconnected. A portion C shows a state where a short circuit occurs between the second wiring connection portion 14b and a display signal line 5a. A portion D shows the repaired state of the short circuit in portion C.

That is, since only portion B is fatally flawed in that the first and second wiring connection portions both exhibit open circuits, the overall occurrence of such fatal disconnection defects is decreased. Also, by cutting the driving line for the capacitor at both sides of the crossing portion of the wirings in portion C by means of a laser beam, the short circuits can be repaired since the wiring connection portions are doubled.

In the liquid crystal display as shown in FIGS. 11 to 14, the first electrodes 10 of the storage capacitors in each pixel region are connected in a row direction. That is, the wiring connection portions are formed so as to cross the display signal lines and to be parallel with the scanning signal lines. The first electrodes of the storage capacitors and the scanning signal lines can be simultaneously formed by using the same material and patterning a conductive layer, which simplifies the manufacturing process.

However, the first electrodes of the storage capacitors in each pixel region may be formed so as to be connected in a column direction. Here, the wiring connection portions cross the scanning signal lines and are made to be parallel with display signal lines. However, the wiring connection portions should be electrically isolated from the scanning signal lines. Therefore, the scanning signal lines and the first electrodes of the storage capacitors should be formed by two separate processes. However, it should be noted that this does not depart from the spirit and scope of the present invention.

According to the embodiments of the present invention as described above, the first electrodes of the capacitor can be formed by a simple change of the pattern when forming the scanning signal lines or when forming the bonding pads without requiring an additional process steps, to thus simplify the processing. Moreover, the first electrode is formed to be a ring-type which can utilize a maximum pixel area, thereby enhancing the aperture ratio of the LCD. Furthermore, since the first electrode of the storage capacitor serves as an additional light shielding layer, the contrast ratio and the effectiveness of the light usage are greatly enhanced. Further, forming the first electrodes of the storage capacitors as an independent wiring type improves the degree of freedom concerning the selection of the driving pulse signal of the liquid crystal display, and it reduces the R-C delay. Due to the reduction of the delay, the liquid crystal display can be applied to a large panel device wherein a uniform image can not easily be achieved due to the delay, and to a TV panel for full color operation by an analog signal. Additionally, duplicating the connecting portions for connecting the first electrodes of the capacitor to each other, can decrease and repair the defects due to disconnection and shorting of the driving lines for the first electrodes occurring in the wiring crossing portions of the wirings, thereby being capable of greatly enhancing the yield of manufactured LCDs.

Figure 16:
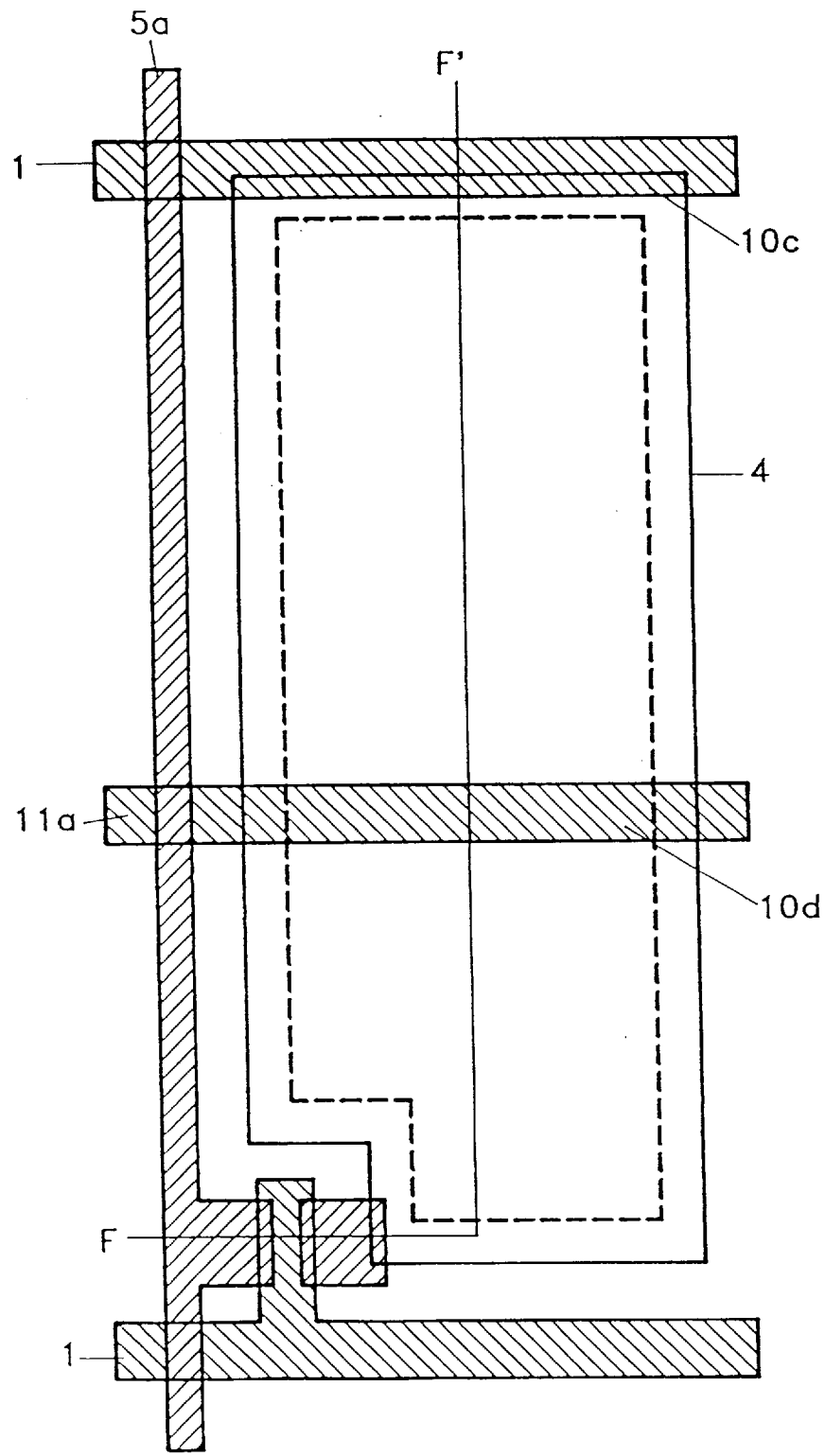
FIG. 16 shows a pixel layout of a liquid crystal display according to a third embodiment of the present invention.

FIG. 16 shows a pixel layout of a liquid crystal display according to a third embodiment of the present invention. Here, the same reference numerals as in the foregoing drawings designates the same components as those in the foregoing drawings.

In FIG. 16, a single pixel region is illustrated. In a complete LCD, rows of a number of scanning signal lines 1 and orthogonal columns of display signal lines 5a are arranged in a matrix configuration on a transparent substrate. Thus, pixels are formed in the regions bounded by these two kinds of lines. In each pixel region, a transparent pixel electrode 4 is provided. As can be seen in FIG. 16, scanning signal line 1 partly overlaps pixel electrode 4 to form an additional capacitance type capacitor. Reference numeral 10c denotes the overlapping portion of a scanning signal line 1 which forms a first electrode of an additional capacitance type capacitor. Further, an independent wiring 11a is provided so as to crossing the center portion of the pixel region in a single wiring form with an insulating layer interposed therebetween. The overlapping portion of the independent wiring 11a with the pixel electrode 4 forms a storage capacitance type capacitor. Reference numeral 10d denotes the overlapping portion of the independent wiring 11a which forms the first electrode of the capacitor.

In the above liquid crystal display, a TFT using a protruding portion of the scanning signal line 1 as a gate electrode and using a protruding portion of the display signal line 5a as a drain electrode is formed near the crossing portion of the scanning signal line 1 and the display signal line 5a as a switching device for applying an electrical signal to the pixel electrode 4 via display signal line 5a. Instead of the TFT, a thin film diode (TFD), for example, a metal insulator metal (MIM) device having two terminals, may be used, as mentioned above. In the meantime, the area defined by the dotted line in the pixel electrode 4 denotes an aperture defined by the light shielding layer (black matrix) formed on the upper substrate of the liquid crystal display panel.

Figure 17:
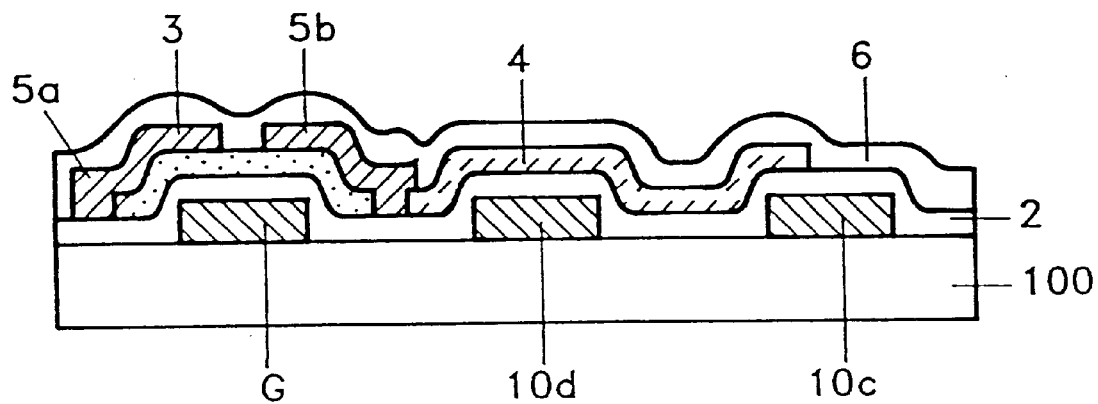
FIG. 17 is a cross-sectional view taken along line F–F' of FIG. 16.

FIG. 17 is a cross-sectional view taken along line F–F' of FIG. 16 which shows the lower substrate of the liquid crystal display panel. With reference to FIG. 17, one embodiment of a method for manufacturing a liquid crystal display as shown in FIG. 16 will be explained below.

First, after preparing a rear glass substrate 100 of the liquid crystal display, a pad metal layer is formed thereon and then patterned to form bonding pads (not shown) for bonding display signal line 5a and scanning signal lines 1 to an external driving circuit. Here, the pad metal layer is formed by depositing chromium to a thickness of approximately 2,000 Å. Thereafter, aluminum is deposited to a thickness not more than 4,000 Å on the front surface of the rear glass substrate, to form a metal layer, which is patterned to simultaneously form scanning signal lines 1 and first electrodes 10d of the storage capacitance type capacitors. Here, each scanning signal line 1 is formed so as to have a protruding portion which extends into each pixel region. The protruding portions are used as gate electrodes of thin film transistors. Also, first electrodes 10c of additional capacitance type capacitors which are constituted by a portion of the scanning signal lines 1 and oppose the pixel electrodes 4 (which are formed in a subsequent step), are simultaneously formed.

For simplifying the manufacturing process, first electrodes 10d of the storage capacitance type capacitor may be formed by using the same material as the pad material. That is, after forming the pad metal layer, the first electrodes 10d are simultaneously formed when patterning the pad metal layer. Alternatively, first electrodes 10d of the storage capacitance type capacitor may be formed via a different step from the step for forming the scanning signal lines 1, by using a different metal from that for scanning signal line 1. When forming the first electrodes 10d of the storage capacitance type capacitor using an opaque metal, the aperture area is reduced as much as the area occupied by the first electrodes 10d. Therefore, forming the first electrodes 10d using a transparent conductive material such as ITO is preferable even though the first electrodes 10d are formed by an additional process.

When scanning signal lines 1 or first electrodes 10c and 10d are made of aluminum, using an anodic oxide method, the surfaces of lines or electrodes can be covered by an aluminum oxide film ($Al_2O_3$) whose thickness is not more than 2,000 Å to enhance the electrical characteristic of the pixel electrodes 4, crossing portions 16 and in the TFTs.

Then, using a chemical vapor deposition (CVD) method, an insulating layer 2 comprising silicon nitride (SiN$x$) and a semiconductor layer 3 comprising an amorphous hydride silicon (a-Si:H) are formed to thicknesses of about 3,000 Å or less and 2,000 Å or less, respectively. At this time, a-Si:H doped with an N-type impurity ($n^+$ a-Si:H) is deposited to form an ohmic layer having a thickness of approximately 500 Å on the previously deposited a-Si:H. Further, when the TFT is formed by using an etching blocking layer, a silicon nitride layer may be formed on the semiconductor layer as an etching blocking layer. Thereafter, the semiconductor layer 3 is patterned so as to define areas in which the switching devices will be placed near the portions where scanning signal lines 1 and display signal lines 5a cross each other.

Successively, the insulating layer 2 on the bonding pads (not shown) is removed, and a transparent conductive material, e.g., ITO, is deposited to a thickness of about 500 Å or below via a sputtering method, and patterned to thereby form pixel electrodes 4 on the insulating layer 2 (i.e. on the same plane as the semiconductor layer 3). At this time, each pixel electrode 4 is patterned to partially overlap its associated first electrode 10c of the storage capacitor formed in the foregoing step by a predetermined width, interposing the insulating layer 2 therebetween. An additional capacitance type capacitor is formed between the first electrode 10c and the pixel electrode 4 in each pixel area by interposing the insulating layer 2 as a dielectric material therebetween and a storage capacitance type capacitor is formed between the first electrode 10d and the pixel electrode 4 in each pixel region, so that a voltage signal input through display signal line 5a is maintained for a predetermined time period until the succeeding input signal arrives.

Then, chromium and aluminum are successively deposited on the whole surface of the substrate to a thicknesses of about 500 Å or less and 5,000 Å or less, respectively, via a sputtering method, and then patterned to form display signal lines 5a, sources 5b and the drain electrodes of the TFT. Thereafter, a protective layer comprising silicon nitride is formed on the whole surface of the substrate to a thickness of about 4,000 Å via a CVD method. Hence, the lower panel of the LCD is completed. Of course, on protective layer 6, an orientation layer (not shown) may be formed in a subsequent step for the orientation of the liquid crystal; which is conventional in the LCD art.

In the meantime, the upper panel of the LCD is completed in such a manner that, after the aperture area of the LCD is defined by forming a light shielding layer on the inner surface of the transparent front glass substrate as matrices along the periphery of each pixel area, the light shielding layer and exposed aperture area are covered with a color filter layer, and a conventional protective layer and transparent upper common electrode are successively formed thereon, thereby completing the multi-layer structure.

The above-described lower and upper panels of the LCD are supported by certain supporting columns, and liquid crystal is injected between them. The panels are then sealed, thereby completing the LCD.

Figure 18:
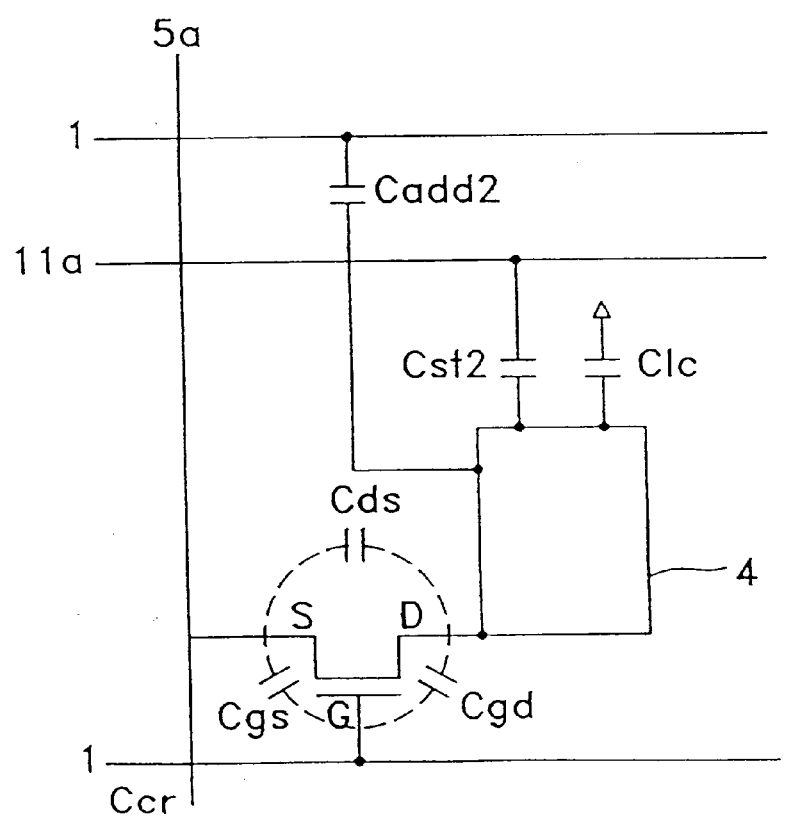
FIG. 18 is an equivalent circuit diagram of the liquid crystal display as shown in FIGS. 16 and 17.

FIG. 18 is an equivalent circuit diagram of the liquid crystal display as shown in FIGS. 16 and 17. In the unit pixels defined by the scanning signal lines 1 and the display signal lines 5a, there exist capacitances such as Ccr (the capacitance formed at the crossing portion of a scanning signal line 1 and display signal line 5a), $Cst_2$ (the capacitance formed between the pixel electrode 4 and the first electrode 10d of the opposing storage capacitance type capacitor), Clc (the capacitance formed between the pixel electrode 4 and the liquid crystal), $Cadd_2$ (the capacitance formed between the pixel electrode 4 and the first electrode 10c of the additional capacitance type capacitor), Cds (the capacitance formed between the source and drain electrodes of the thin film transistor), Cgs (the capacitance formed between the gate and source electrodes) and Cgd (the capacitance formed between the gate and drain electrodes).

Figure 1:
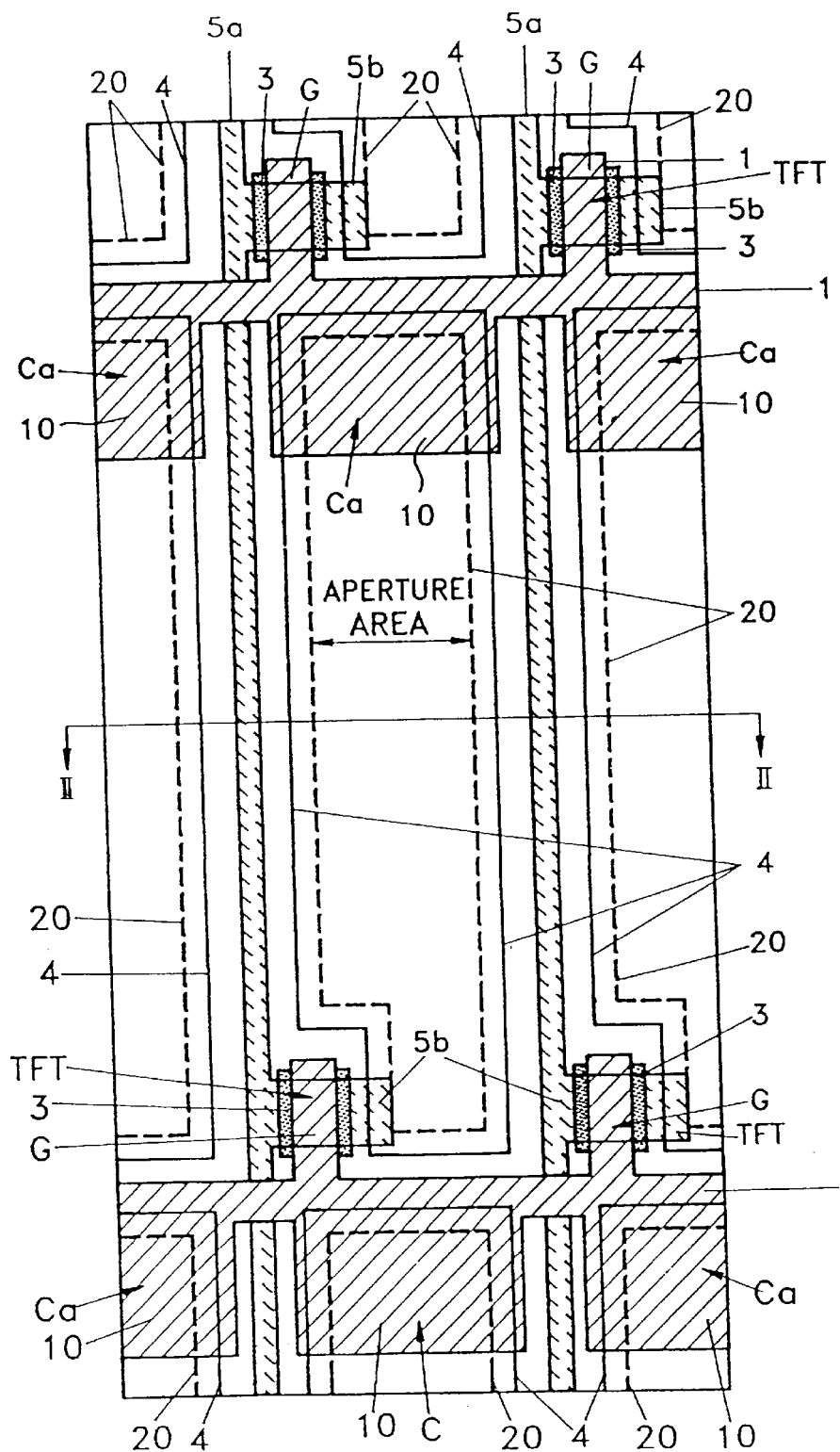
FIG. 1 is a pixel layout of a conventional liquid crystal display on which additional capacitance type capacitors are formed.
Figure 2:
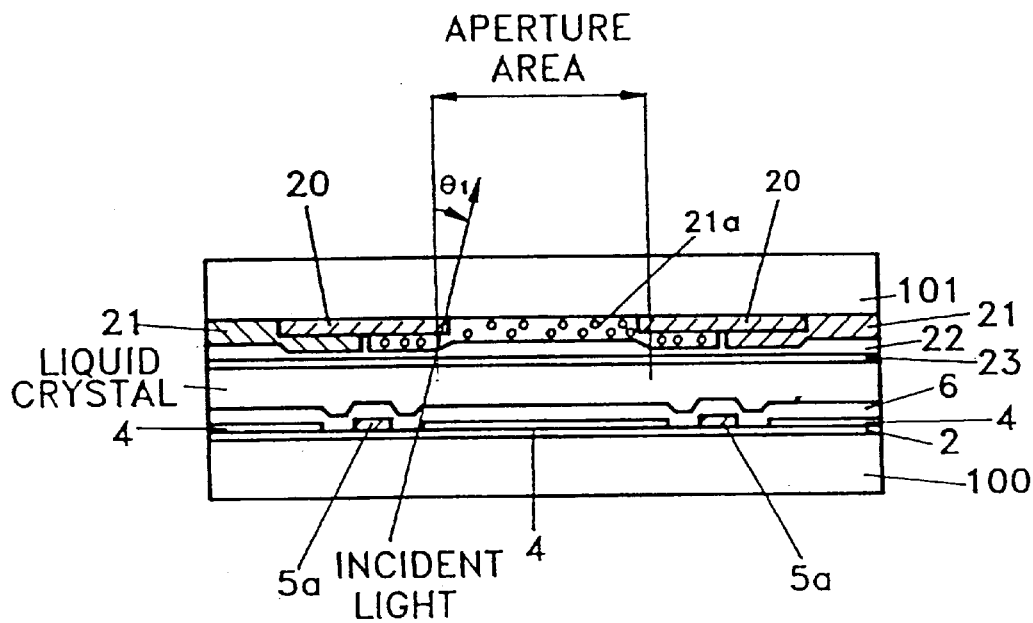
FIG. 2 is a cross-sectional view taken along line II—II of FIG. 1.
Figure 3:
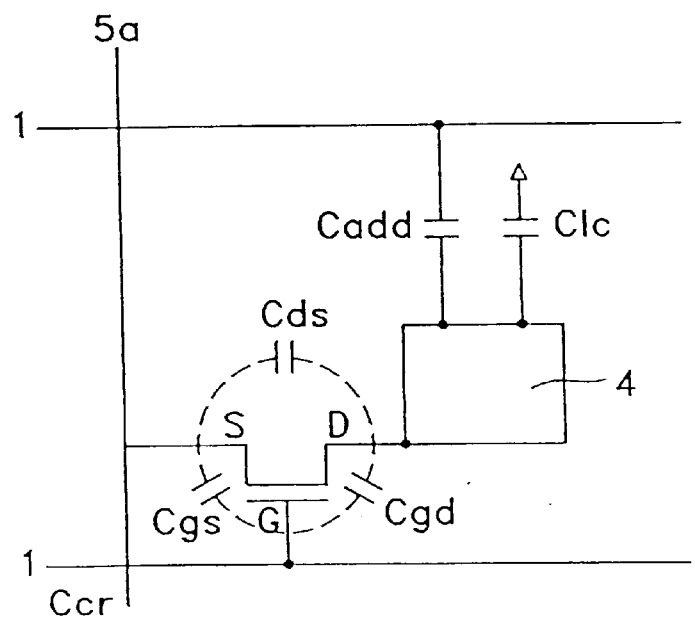
FIG. 3 is an equivalent circuit diagram of the LCD device of the conventional additional capacitance capacitor type as shown in FIGS. 1 and 2.
Figure 6:
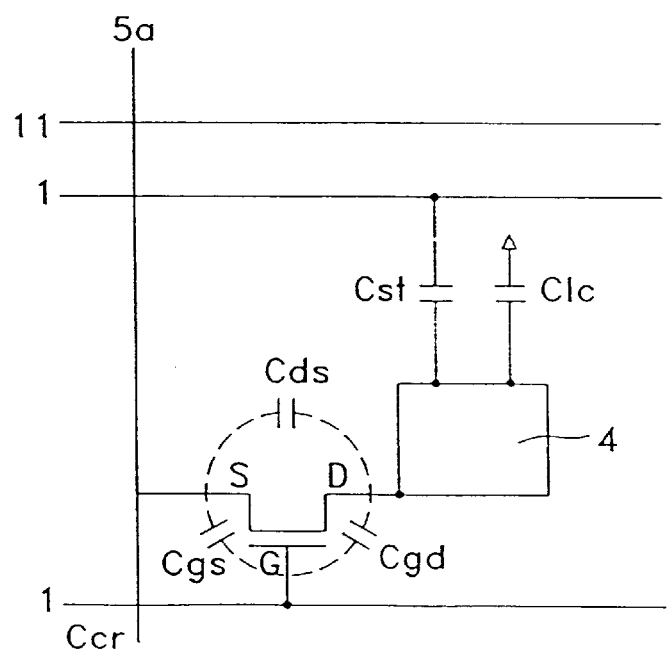
FIG. 6 is an equivalent circuit diagram of the LCD device of the conventional storage capacitance capacitor type as shown in FIGS. 4 and 5.

Generally, in order to secure image uniformity in an active matrix type liquid crystal display, the voltage of a first signal applied through a data line in the writing operation should be held constant for a certain time until a second signal is received, when assuming that a storage capacitor having a predetermined capacitance is formed in parallel with a liquid crystal cell, the following equation will be obtained from the circuits of FIGS. 3, 6 and 18.

$$Ca = Cs = Cadd_2 + Cst_2 \qquad (3)$$

Further, the capacitance of the scanning signal line (Cssl) according to the third embodiment of the present invention is as follows.

$$Cssl = Cin + 1/[(1/Cadd_2) + \{1/(Clc + Cgd + Cst_2)\}] \qquad (4)$$

Figure 4:
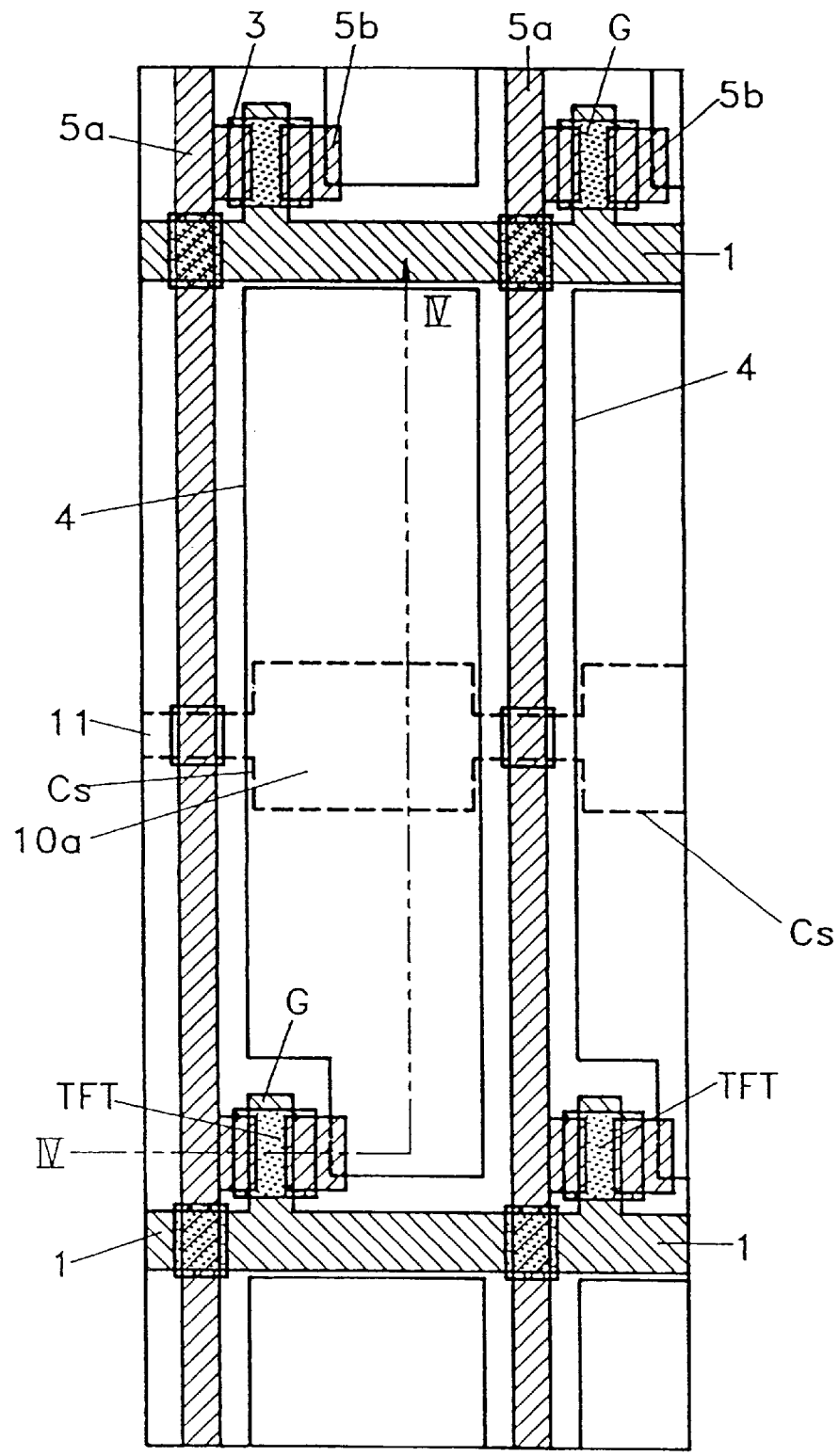
FIG. 4 is a pixel layout of a conventional liquid crystal display having independent wiring-type storage-capacitance capacitors formed in parallel with the liquid crystal cells.
Figure 5:
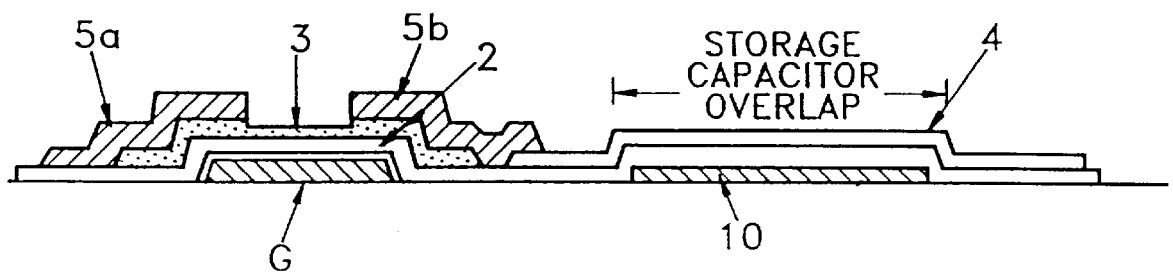
FIG. 5 is a cross-sectional view taken along line IV—IV of FIG. 4.

As can be seen from the above equation, the gate wiring capacitance of the present embodiment is smaller than that of an LCD which has only an additional capacitance type capacitor as shown in FIG. 4.

In the meantime, in order to optimize the ratio of the gate wiring capacitance $Cadd_2$ due to the additional capacitance type capacitor with respect to the gate wiring capacitance $Cst_2$ due to the storage capacitance type capacitor, a trade-off is performed by considering the improvement in the aperture ratio obtainable by employing the additional capacitance type capacitor and the reduction in the gate wiring capacitance obtainable by employing the storage capacitance type capacitor.

An example of the trade-off will be illustrated as follows. In a 15"-sized liquid crystal display panel of the Engineering Work Station Standard having 1280×1024 pixels, when the pixel size is 80 μm×240 μm, the gate wiring resistance (R) is 3.41KΩ, the capacitance (Ccr) of the wiring crossing portion of the scanning signal line and the display signal line is 0.04 pF, the capacitance of the liquid crystal (Clc) is 0.16 pF, the sum of the additional capacitance ($Cadd_2$) and the storage capacitance ($Cst_2$) is 0.3 pF, the capacitance (Cgd) between the gate electrode and the drain electrode is 0.02 pF and the capacitance (Cgs) between the gate electrode and the source electrode is 0.02 pF, the RC time constant in accordance with the ratio of the additional capacitance ($Cadd_2$) with respect to the storage capacitance ($Cst_2$) is as follows.

TABLE 1

| $Cst_2$ (%):$Cadd_2$ (%) | RC time constant (μsec) | Ratio with respect to the storage capacitor type |
| --- | --- | --- |
| 0:100 | 2.51 | 2.42 |
| 10:90 | 2.58 | 2.49 |
| 20:80 | 2.61 | 2.51 |
| 30:70 | 2.58 | 2.49 |

TABLE 1-continued

| $Cst_2$ (%):$Cadd_2$ (%) | RC time constant (μsec) | Ratio with respect to the storage capacitor type |
| --- | --- | --- |
| 40:60 | 2.51 | 2.42 |
| 50:50 | 2.38 | 2.30 |
| 60:40 | 2.21 | 2.13 |
| 70:30 | 1.99 | 1.92 |
| 80:20 | 1.72 | 1.66 |
| 90:10 | 1.40 | 1.35 |
| 100:0 | 1.03 | 1.00 |

In the above Table 1, the ratio of $Cst_2$ to $Cadd_2$ can be defined as the ratio of the area occupied by the first electrode of the storage capacitance type capacitor with respect to the area occupied by the first electrode of the additional capacitance type capacitor. As can be seen in Table 1, it can be noted that when the ratio of the storage capacitance to the additional capacitance is more than 80:20, an RC time constant less than 1.66 tines as much as that of the conventional storage type liquid crystal display results, which is efficient.

In the meantime, many variations concerning the additional capacitance type capacitor and the storage capacitor with respect to the third embodiment of the present invention are possible.

Figure 7:
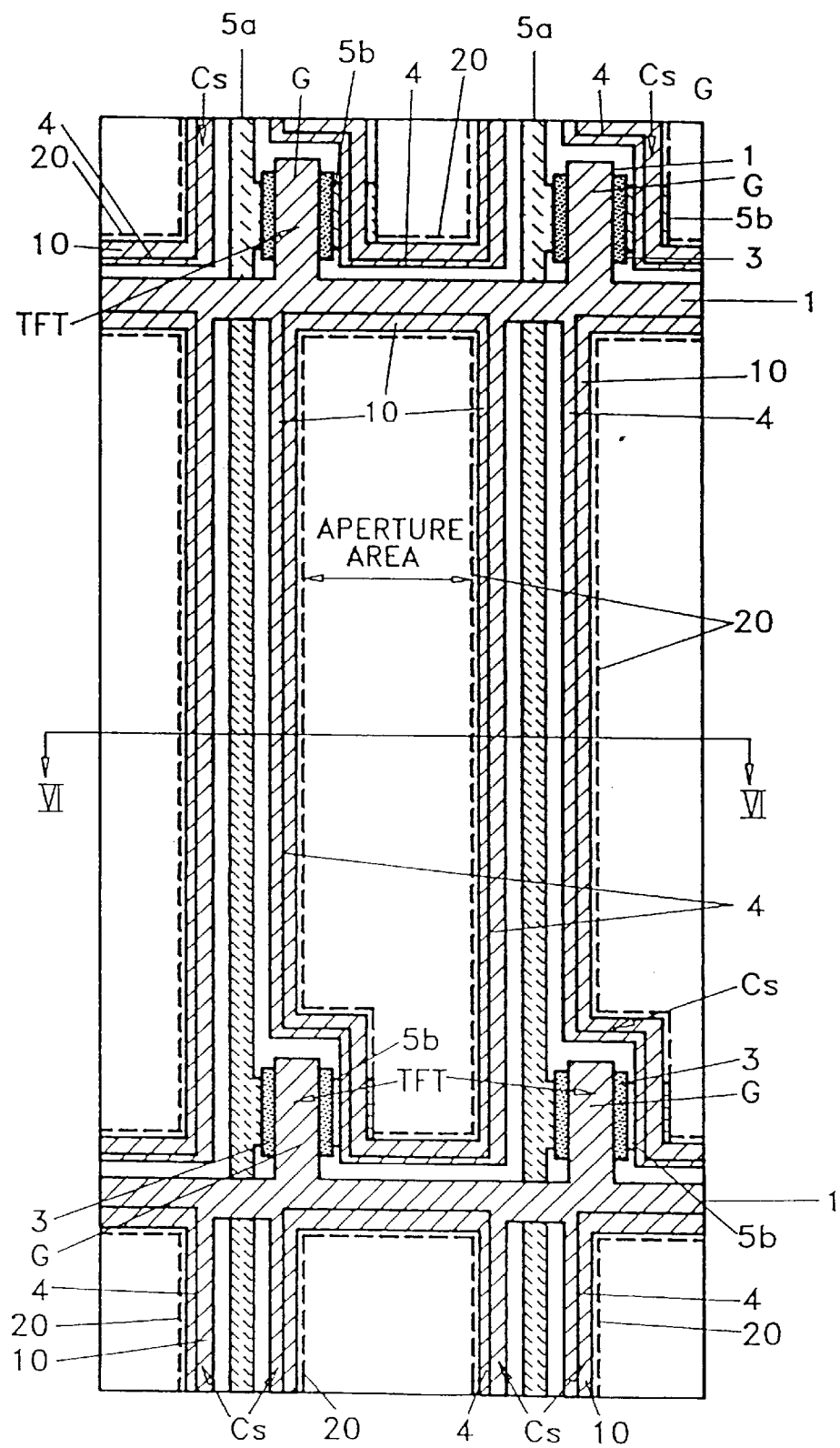
FIG. 7 is a pixel layout of a liquid crystal display disclosed in U.S. Pat. No. 5,339,181.
Figure 8:
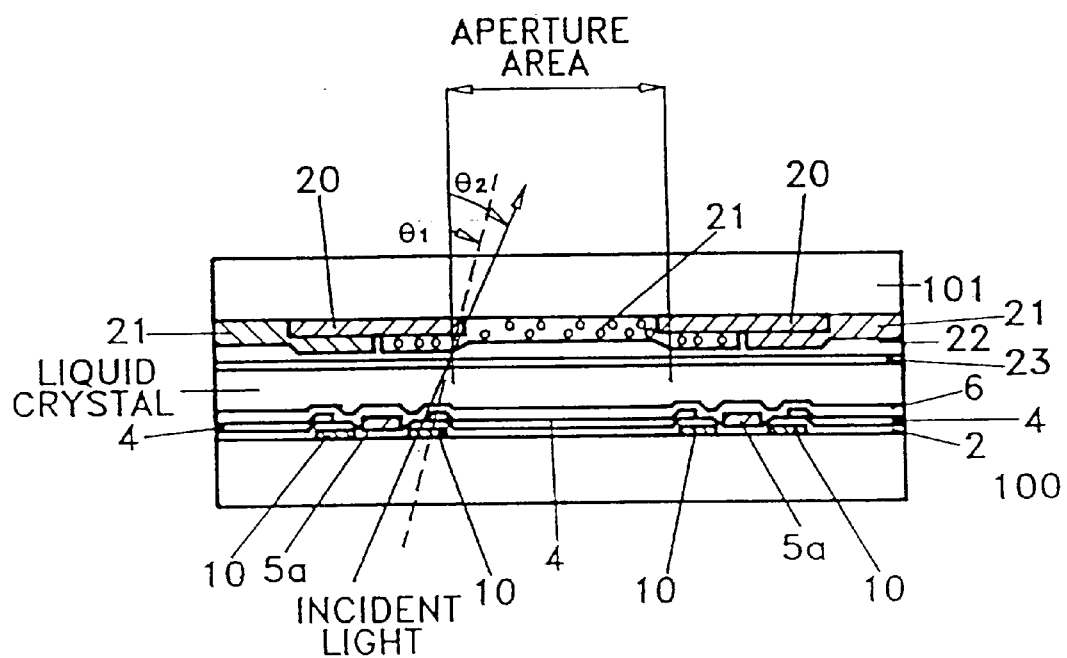
FIG. 8 is a cross-sectional view taken along line VI—VI of FIG. 7.
Figure 19:
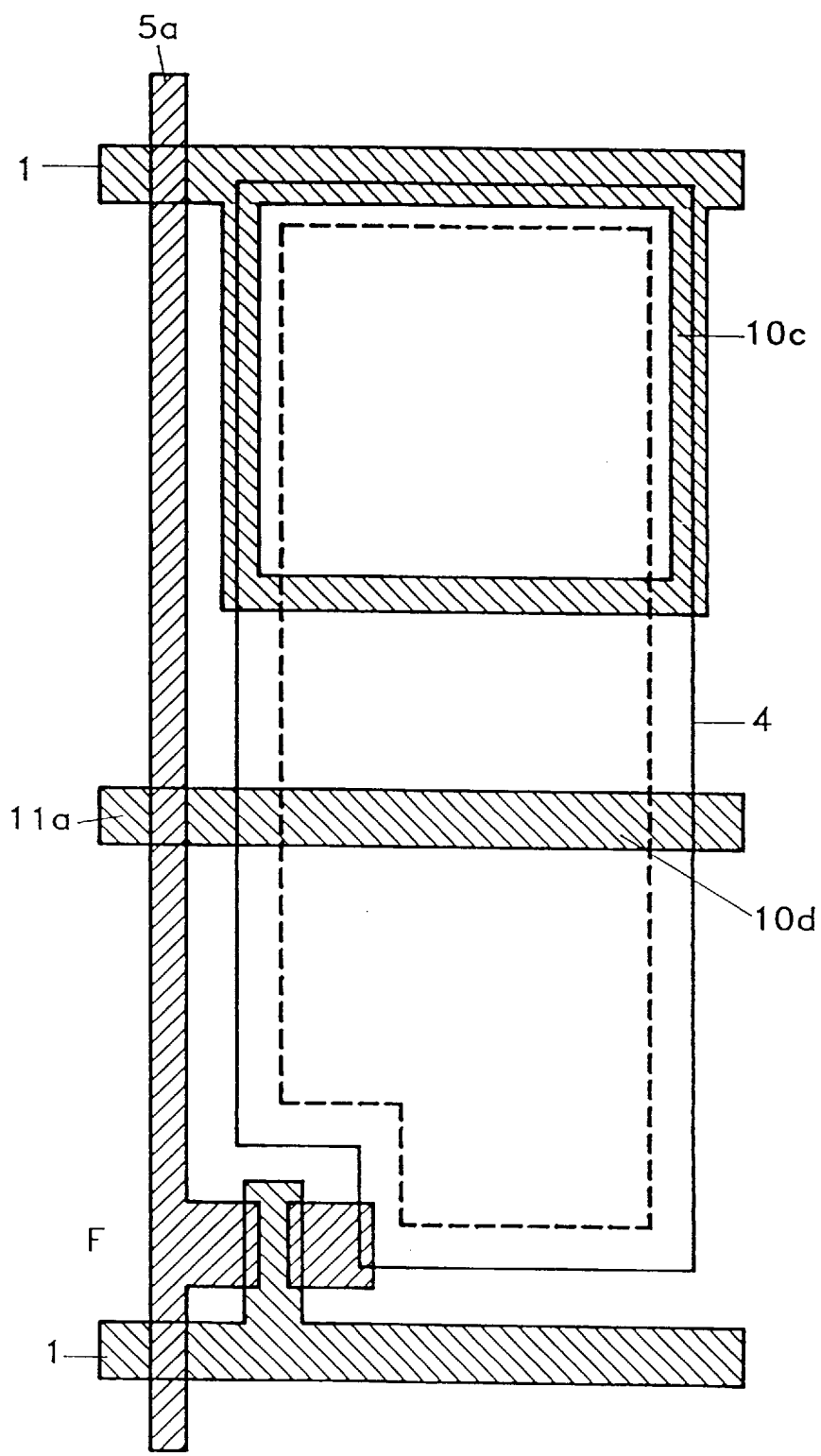
FIG. 19 shows a pixel layout of the liquid crystal display according to a fourth embodiment of the present invention.

For example, the first electrode of the additional capacitance type capacitor may be formed as a ring type electrode as shown in FIG. 7. FIG. 19 shows a pixel layout of the liquid crystal display according to a fourth embodiment of the present invention.

Referring to FIG. 19, the liquid crystal display according to this embodiment is characterized in that first electrode 10c of the additional capacitance is formed in a ring shape so as to partially overlap along the periphery of the pixel electrode 4. The first electrode 10c is formed in a ring shape in the pixel region between the first electrode 10d of the additional capacitance type capacitor and the scanning signal line 1 for operating the adjacent pixel electrode. The present embodiment reflects the improvement of the aperture ratio which can be achieved by the ring type first electrode of the LCD as shown in FIG. 7. The area defined by the dotted line in the pixel electrode 4 denotes an aperture area defined by the light shielding layer (black matrix) formed on the upper panel of the liquid crystal display panel. Further, the liquid crystal display in the present embodiment only differs from the liquid crystal display as shown in FIG. 16 in that the first electrode 10c of the additional capacitor is formed as a ring type electrode between the first electrode 10d of the storage capacitor and the scanning signal line 1 for operating the adjacent pixel electrode. The liquid crystal display as shown in FIG. 19 can be manufactured in the same manner as when forming the liquid crystal display as shown in FIG. 16, except that when forming the first electrode 10c of the additional capacitor, a mask having the same layout as shown in FIG. 19 is used. Optimization of the ratio between the additional capacitance and the storage capacitance is performed as mentioned with reference to the above Table 1.

In the meantime, FIG. 19 shows a pixel layout wherein the first electrode of the additional capacitor is formed as a ring type electrode. However, the first electrode 10d of the storage capacitor may formed as a ring type electrode instead of the first electrode 10c of the additional capacitor, as shown in FIG. 11. In such a case, the manufacturing process is the same as in forming the liquid crystal display as shown in FIG. 16, except that when forming the first electrode 10*d* of the storage capacitor, a mask forming the first electrode 10*d* of the storage electrode which has the layout surrounding the pixel electrode 4 along the periphery thereof is used. Also, optimization of the ratio between the additional capacitance and the storage capacitance is performed as mentioned with reference to the above Table 1.

Further, according to another embodiment of the present invention, both the first electrode 10*c* of an additional capacitor and the first electrode 10*d* of the storage capacitor may be formed as a ring type electrode so as to surround along the periphery of the pixel electrode 4.

Meanwhile, the liquid crystal display according to a third embodiment of the present invention represents an improvement in display characteristics, i.e., a better aperture ratio, increased contrast ratio, etc. However, due to the introduction of foreign matter or a weak insulating film at wiring crossings (the intersections of scanning signal lines 1 and display signal lines 5*a* or the intersections of display signal lines 5*a* and independent wirings 11*a* for connecting the first electrodes 10*d* of the storage capacitance type capacitors), wiring disconnections in scanning signal lines 1 and/or short circuits between scanning signal lines 1 and display signal lines 5*a* or between display signal lines 5*a* and independent wirings 11*a* for connecting the first electrodes 10*d* of the storage capacitance type capacitors may occur, to thereby significantly lower the yield of manufactured liquid displays.

Figure 9:
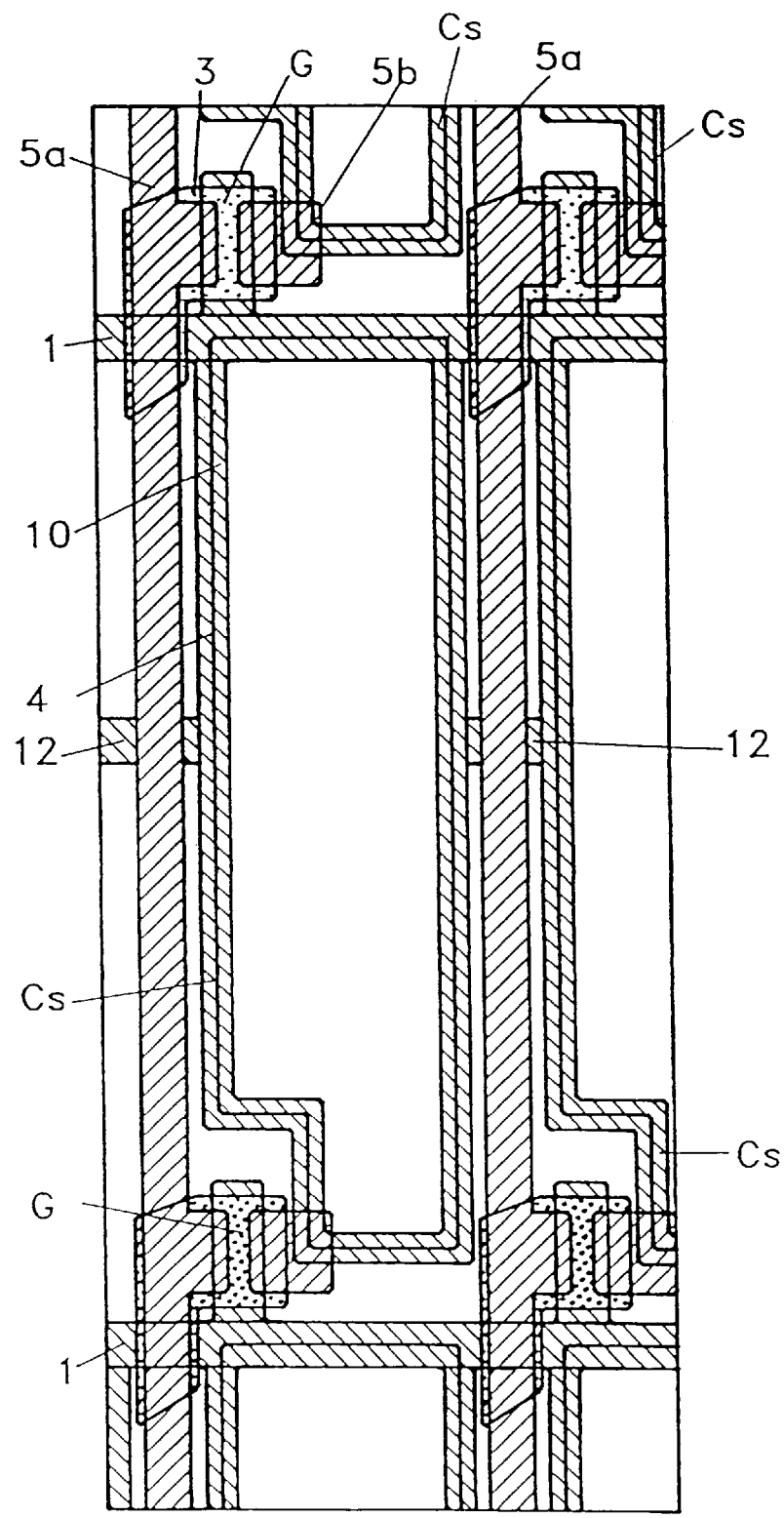
FIG. 9 shows a pixel layout of a liquid crystal display according to one embodiment of the invention disclosed in the above U.S. Pat. No. 5,517,341.
Figure 10:
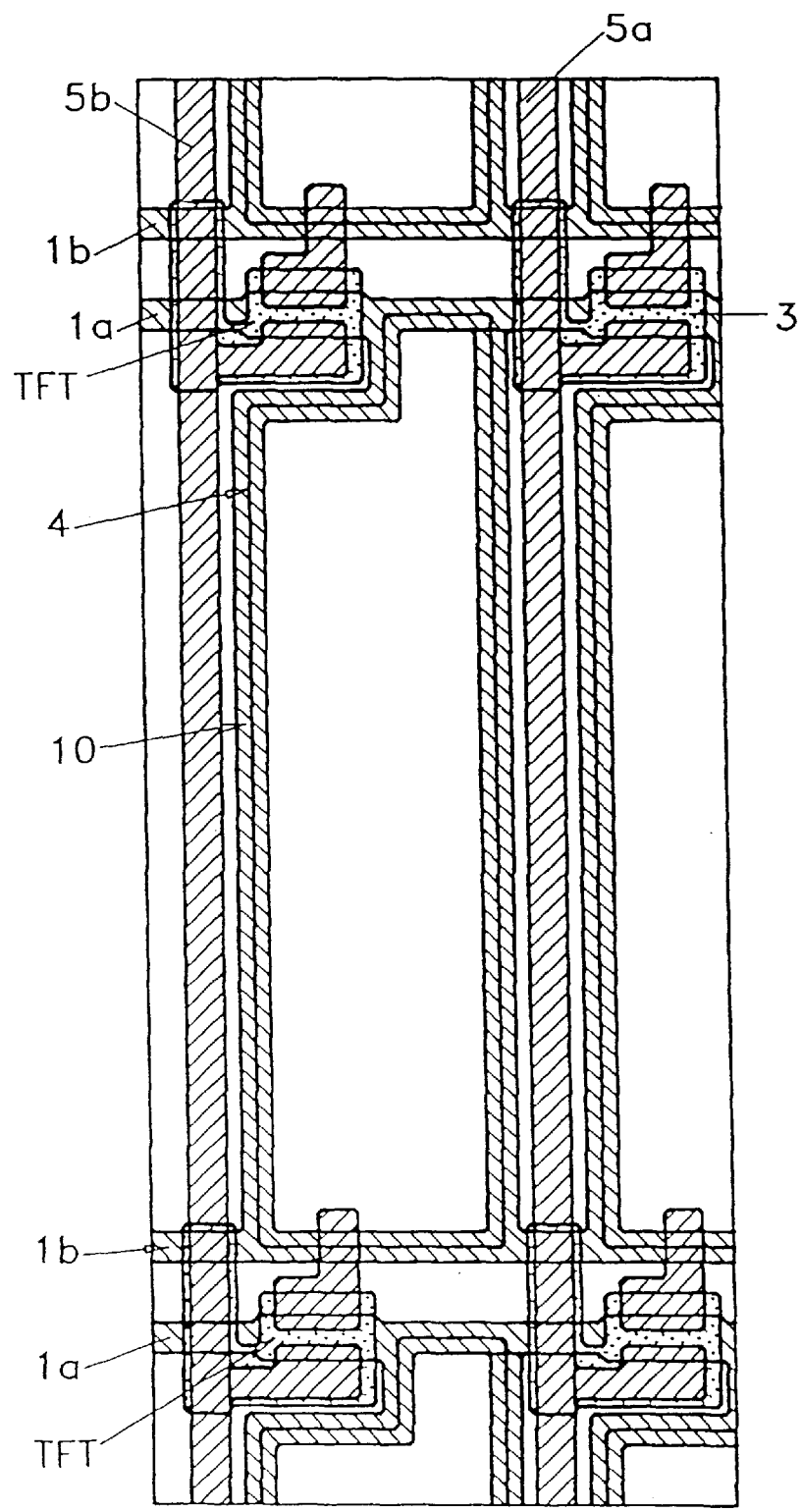
FIG. 10 shows a pixel layout of a liquid crystal display according to another embodiment of the invention disclosed in the above U.S. Pat. No. 5,517,341.
Figure 20:
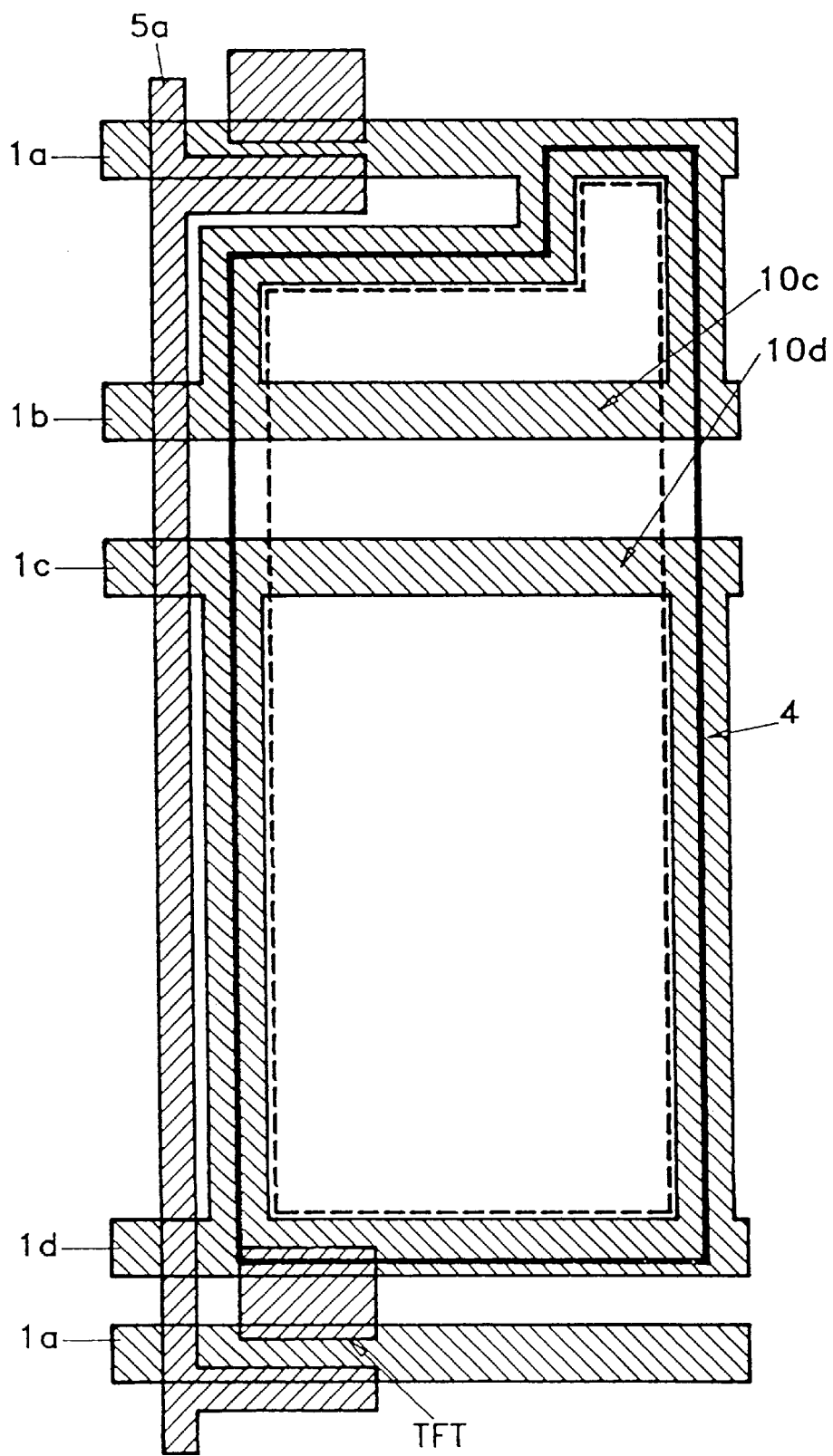
FIG. 20 show a pixel layout according to a fifth embodiment of the present invention.

In order to solve the problems of wiring fractures in scanning signal lines 1 and/or short circuits between scanning signal lines 1 and display signal lines 5*a* without reducing the aperture ratio and the contrast ratio, the scanning signal lines and the independent wirings for driving the first electrodes 10*d* of the storage capacitors may be duplicated as shown in FIGS. 9, 10 and 14. FIG. 20 show a pixel layout according to a fifth embodiment of the present invention wherein the scanning signal lines and the independent wirings for driving the first electrodes of the storage capacitors are duplicated.

In the liquid crystal display as shown in FIG. 20, each scanning signal line is duplicated into a first scanning signal line 1*a* and a second scanning signal line 1*b*. The first electrode 10*c* of the additional capacitance type capacitor which is electrically connected to first scanning signal line 1*a*, is formed so as to surround the pixel electrode 4 along the peripheral portion thereof between the second scanning line 1*b* and the first scanning signal line 1*a* for driving the adjacent pixel electrode. Also, each independent wiring for driving the first electrodes of the storage capacitance type capacitors is duplicated into a first independent wiring 1*c* and a second independent wiring 1*d*. The first electrode of the storage capacitance type capacitor is formed so as to surround the pixel electrode 4 along the peripheral region thereof between the first and second independent wirings 1*c* and 1*d*.

In the liquid crystal display as shown in FIG. 20, disconnections and/or short circuits which may occur at the wiring crossing portions, can be easily repaired. The liquid crystal display as shown in FIG. 20 can be manufactured in the same manner as when manufacturing the liquid crystal displays as shown in FIGS. 16 and 19 by simply altering the layout for forming the first electrodes of the additional capacitors and the first electrodes of the storage capacitors. Also, optimization of the ratio between the additional capacitance and the storage capacitance may be performed as mentioned with reference to the above Table 1.

The ratio of the storage capacitance with respect to the additional capacitance can be varied in order to improve the aperture ratio and/or in order to reduce the capacitance of the scanning signal lines. Further, the first electrodes of the additional capacitance type capacitors and the storage capacitance type capacitors can be formed so as to have various shapes. Additionally, the manufacturing method of the liquid crystal display as described above can be varied according to the selection of the material for forming the first electrodes of the storage capacitance type capacitors and the additional capacitance type capacitors.

According to the third to fifth embodiments of the present invention, the gate wiring capacitance can be decreased when compared to the liquid crystal display having the additional capacitance type capacitors so as to reduce the RC time constant. Therefore, a liquid crystal display having a uniform image can be obtained. Further, the aperture ratio is improved when compared to a liquid crystal display having the storage capacitance type auxiliary capacitors so that a liquid crystal display device having improved brightness and/or contrast ratio can be realized.

According to the fifth embodiment of the present invention as described above, the redundancy connecting portions for connecting the first electrodes of the storage capacitors or the two-fold scanning signal lines are formed by a simple change of the pattern without requiring an additional process, to thus simplify the processing. Since redundancy connecting portions are formed for connecting the first electrodes of the capacitors to each other, or the scanning signal lines are doubled, the defects of disconnection and shorting of the scanning signal lines occurring in the crossing portion of the wirings can be decreased and repaired, thereby being capable of greatly enhancing the yield of manufactured LCDs.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A liquid crystal display device comprising:

a transparent substrate;

a plurality of scanning signal lines and a plurality of first capacitance, lines, alternately formed on the substrate;

an insulating layer formed on the scanning signal lines and at the first capacitance lines;

a plurality of display signal lines formed on the insulating layer intersecting the scanning signal lines and the first capacitance lines to thereby define a plurality of pixel regions, each bordered by a pair of the consecutive scanning signal lines and a pair of the consecutive display signal lines;

a plurality of pixel electrodes respectively formed corresponding to one of the pixel regions; and a plurality of thin film transistors respectively connected electrically with one of the scanning signal lines, one of the display signal lines and one of the pixel electrodes corresponding to one of the pixel regions;

wherein one of the pixel electrodes at least partially overlaps one of the plurality of scanning signal lines and one of the plurality of first capacitance lines.

2. A liquid crystal display device as claimed in claim 1, wherein:

the plurality of scanning signal lines and the plurality of capacitance lines are formed of the same material.

3. A liquid crystal display device as claimed in claim 1, wherein:

the plurality of capacitance lines each comprise a portion which partially overlaps with the periphery of each of the plurality of pixel electrodes.

4. A liquid crystal display device as claimed in claim 3, wherein:

the plurality of scanning lines or the plurality of capacitance liens comprise ring-type lines.

5. A liquid crystal display device as claimed in claim 1, wherein:

the plurality of scanning lines each comprises a portion which protrudes into each of the plurality of pixel electrodes to partially overlap with each of the plurality of pixel electrodes.

6. A liquid crystal display device as claimed in claim 5, wherein:

the plurality of scanning lines or the plurality of capacitance liens comprise ring-type lines.

* * * * *